United States Patent
Nakajima et al.

(10) Patent No.: US 10,090,312 B2
(45) Date of Patent: Oct. 2, 2018

(54) SEMICONDUCTOR MEMORY DEVICE

(71) Applicant: TOSHIBA MEMORY CORPORATION, Minato-ku (JP)

(72) Inventors: Shingo Nakajima, Yokkaichi (JP); Hiroyasu Tanaka, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/241,534

(22) Filed: Aug. 19, 2016

(65) Prior Publication Data

US 2017/0186761 A1 Jun. 29, 2017

Related U.S. Application Data

(60) Provisional application No. 62/272,115, filed on Dec. 29, 2015.

(51) Int. Cl.
| | |
|---|---|
| *H01L 27/115* | (2017.01) |
| *H01L 29/788* | (2006.01) |
| *H01L 27/11556* | (2017.01) |
| *H01L 27/11519* | (2017.01) |
| *H01L 27/11521* | (2017.01) |
| *H01L 27/11582* | (2017.01) |

(52) U.S. Cl.
CPC .. *H01L 27/11556* (2013.01); *H01L 27/11519* (2013.01); *H01L 27/11521* (2013.01); *H01L 27/11582* (2013.01); *H01L 29/7883* (2013.01)

(58) Field of Classification Search
CPC ....................... H01L 27/11556; H01L 29/7883
See application file for complete search history.

(56) References Cited

U.S. PATENT DOCUMENTS

| | | |
|---|---|---|
| 7,936,004 B2 | 5/2011 | Kito et al. |
| 8,587,051 B2 | 11/2013 | Takasu |
| | (Continued) | |

FOREIGN PATENT DOCUMENTS

| | | |
|---|---|---|
| JP | 2007-266143 | 10/2007 |
| JP | 2011-198963 | 10/2011 |
| | (Continued) | |

*Primary Examiner* — Moazzam Hossain
*Assistant Examiner* — Farun Lu
(74) *Attorney, Agent, or Firm* — Oblon, McClelland, Maier & Neustadt, L.L.P.

(57) ABSTRACT

According to the embodiments, the semiconductor memory device includes a semiconductor substrate, a first conducting layer, a semiconductor layer, a plurality of second conducting layer, and an electric charge accumulating layer. The first conducting layer is disposed on the semiconductor substrate via an insulating layer. The semiconductor layer is disposed on the first conducting layer and extends in a first direction above the semiconductor substrate. The plurality of the second conducting layers extends in a second direction intersecting with the first direction, and is laminated along the first direction via an insulating layer, and is disposed on the first conducting layer. The electric charge accumulating layer is disposed between the semiconductor layer and the plurality of second conducting layer. The semiconductor substrate includes an n type semiconductor region facing an end portion of the semiconductor layer.

15 Claims, 25 Drawing Sheets

(56) References Cited

U.S. PATENT DOCUMENTS

| | | | |
|---|---|---|---|
| 2013/0107620 A1* | 5/2013 | Tanzawa | G11C 16/04 365/185.01 |
| 2013/0248965 A1* | 9/2013 | Nakai | H01L 29/788 257/315 |
| 2016/0181272 A1* | 6/2016 | Rabkin | H01L 21/02653 438/268 |
| 2016/0225785 A1* | 8/2016 | Kim | H01L 27/11575 |

FOREIGN PATENT DOCUMENTS

| | | |
|---|---|---|
| JP | 2012-146957 | 8/2012 |
| JP | 2014-60420 | 4/2014 |

* cited by examiner

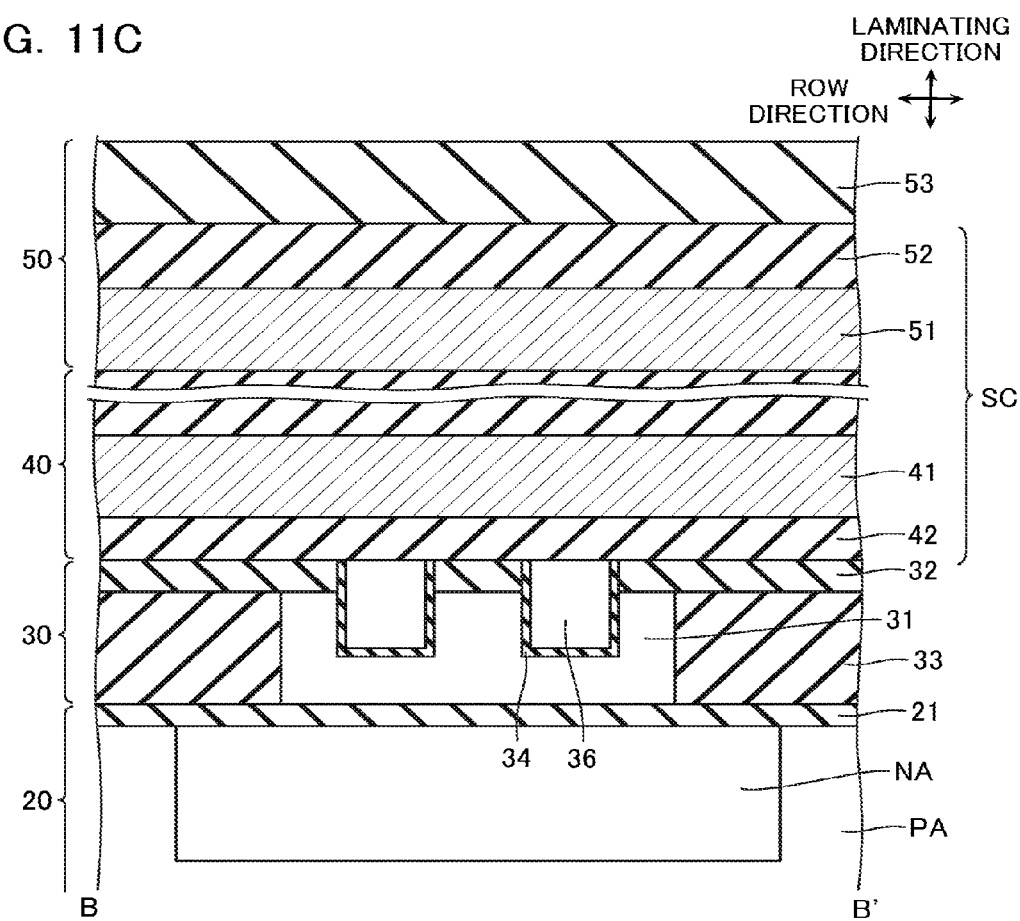

SEMICONDUCTOR MEMORY DEVICE

CROSS REFERENCE TO RELATED APPLICATION

This application is based upon and claims the benefit of priority from U.S. Provisional Patent Application No. 62/272,115, filed on Dec. 29, 2015, the entire contents of which are incorporated herein by reference.

FIELD

Embodiments described herein relate generally to a semiconductor memory device.

BACKGROUND

Description of the Related Art

A memory cell that constitutes a semiconductor memory device such as a NAND flash memory includes a semiconductor layer, a control gate electrode, and an electric charge accumulating layer. The memory cell varies a threshold voltage corresponding to an electric charge charged on the electric charge accumulating layer to store data in a non-volatile manner based on the magnitude of the threshold voltage. Recently, such semiconductor memory devices have been large capacity and highly integrated. Then, to achieve the large capacity and the high integration of a memory, a semiconductor memory device whose memory cells are three-dimensionally disposed (three-dimensional semiconductor memory device) has been proposed.

BRIEF DESCRIPTION OF THE DRAWINGS

FIG. 5A to FIG. 13A are plan views illustrating a manufacturing method for the semiconductor memory device;

FIG. 5B to FIG. 13B are cross-sectional views illustrating the manufacturing method for the semiconductor memory device, and are cross-sectional views taken along lines A-A' in FIG. 5A to FIG. 13A, respectively;

FIG. 5C to FIG. 13C are cross-sectional views illustrating the manufacturing method for the semiconductor memory device, and are cross-sectional views taken along lines B-B' in FIG. 5A to FIG. 13A, respectively;

DETAILED DESCRIPTION

A semiconductor memory device according to the embodiments described below includes a semiconductor substrate, a first conducting layer, a semiconductor layer, a plurality of second conducting layer, and an electric charge accumulating layer. The first conducting layer is disposed on the semiconductor substrate via an insulating layer. The semiconductor layer is disposed on the first conducting layer and extends in a first direction above the semiconductor substrate. The plurality of the second conducting layers extends in a second direction intersecting with the first direction, and is laminated along the first direction via an insulating layer, and is disposed on the first conducting layer. The electric charge accumulating layer is disposed between the semiconductor layer and the plurality of second conducting layer. The semiconductor substrate includes an n type semiconductor region facing an end portion of the semiconductor layer.

First Embodiment

Overall Configuration

Figure 1:
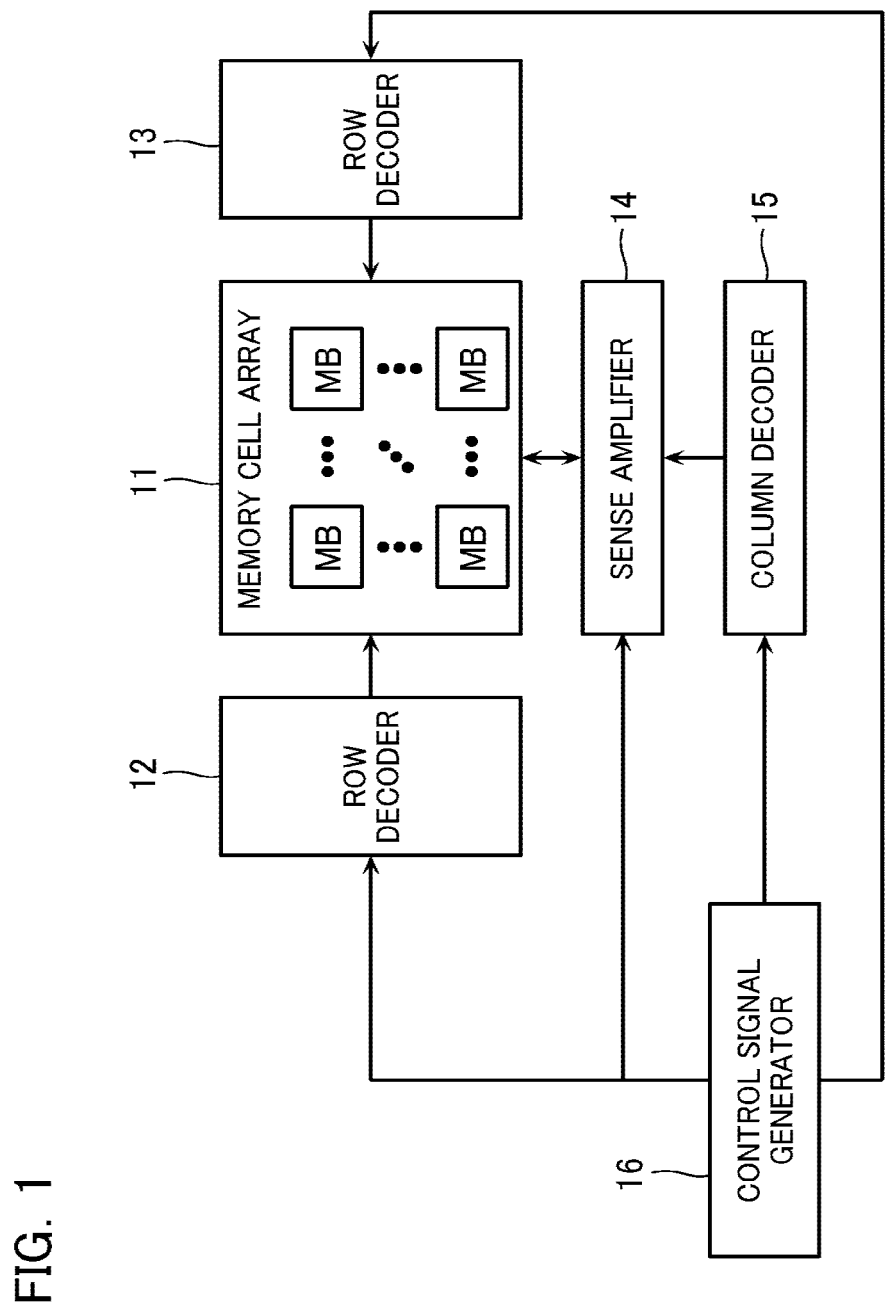
FIG. 1 is a block diagram illustrating a schematic configuration of a semiconductor memory device according to a first embodiment.

The following describes a configuration of a semiconductor memory device according to a first embodiment. FIG. 1 is a block diagram illustrating the semiconductor memory device according to the first embodiment.

As shown in FIG. 1, the semiconductor memory device according to the first embodiment includes a memory cell array 11, row decoders 12 and 13 that control the memory cell array 11 to read and write, a sense amplifier 14, a column decoder 15, and a control signal generator 16.

The memory cell array 11 is constituted of a plurality of memory blocks MB. Each memory block MB includes a plurality of memory transistors MTr (not illustrated, described below in FIG. 2 and FIG. 3) that are three-dimensionally disposed and store data in a non-volatile manner. Each memory block MB constitutes a minimum erasure unit to be collectively erased in the case where a data erasure operation is executed. The memory transistors MTr are disposed in a matrix form (three-dimensionally) in a row direction, a column direction and a laminating direction.

As shown in FIG. 1, the row decoders 12 and 13 decode retrieved block address signals or similar signal to control the memory cell array 11.

The sense amplifier 14 reads out data from the memory cell array 11.

The column decoder 15 decodes column address signals to control the sense amplifier 14.

The control signal generator 16 boosts a reference voltage to generate a voltage necessary for writing, erasure, and reading. The control signal generator 16 further generates control signals to control the row decoders 12 and 13, the sense amplifier 14, and the column decoder 15.

Figure 2:
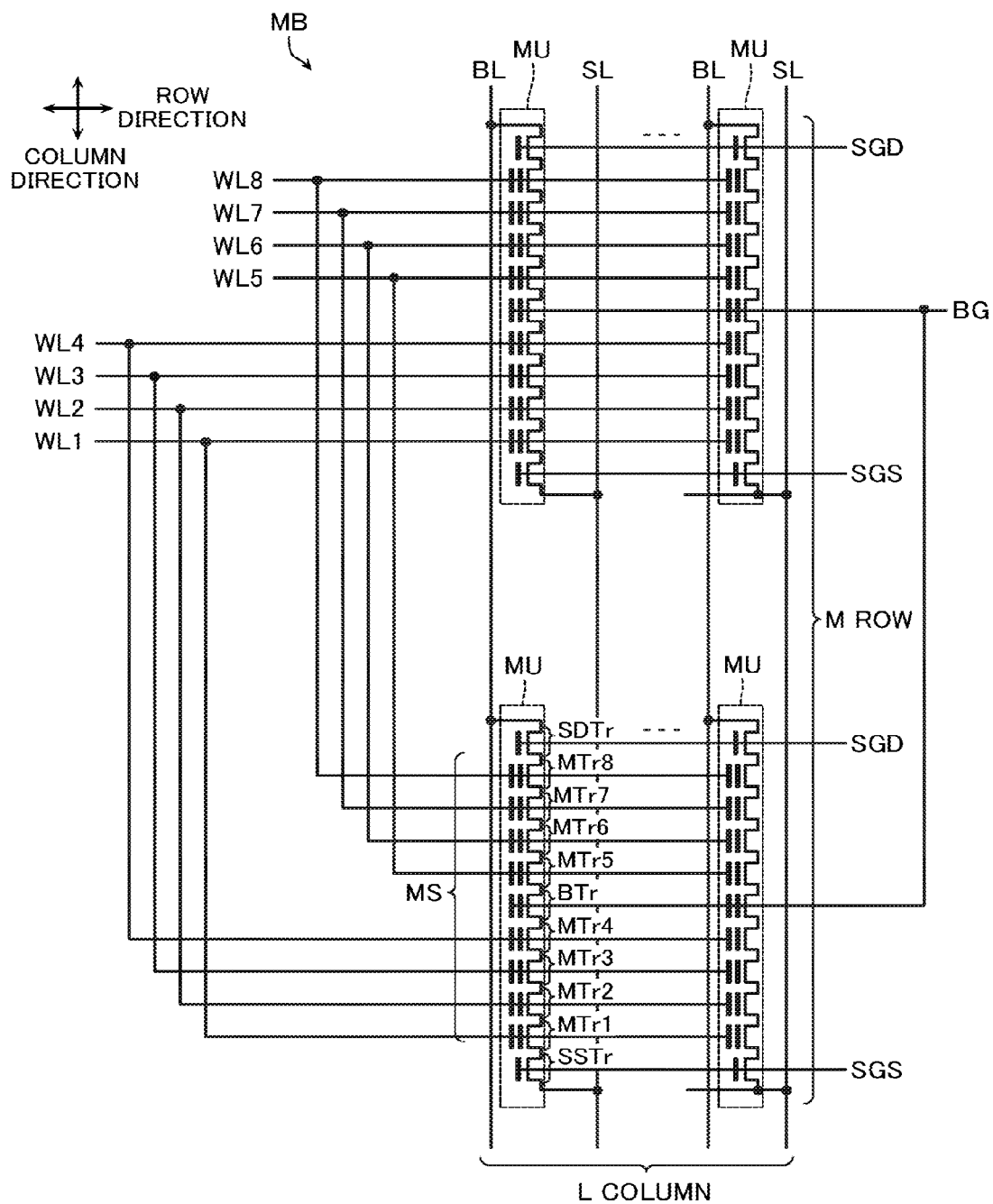
FIG. 2 is a circuit diagram illustrating a part of a configuration of the semiconductor memory device.

Next, a description will be given of a specific configuration of the memory block MB with reference to FIG. 2. FIG. 2 is a circuit diagram illustrating the specific configuration of the memory block MB. The memory block MB includes a plurality of bit lines BL, a plurality of source lines SL, and a plurality of memory units MU that is connected to the bit line BL and the source line SL. The memory units MU are disposed L piece(s) along a row direction, and M piece(s) along a column direction.

The memory unit MU constitutes a NAND flash memory. The memory unit MU has a configuration in which a source side selection transistor SSTr and a drain side selection transistor SDTr are connected to both ends of a memory string MS. The memory string MS is constituted of memory transistors MTr1 to MTr8 and a back gate transistor BTr, which are connected in series. Accumulating electric charges on an electric charge accumulating layer of the memory transistors MTr1 to MTr8 varies threshold voltages of the memory transistor MTr1 to MTr8. This ensures to hold data corresponding to the threshold voltages.

Drains of the drain side selection transistors SDTr of the plurality of the memory units MU disposed in the column direction are connected to a common bit line BL. Sources of the source side selection transistors SSTr of the plurality of the memory units MU disposed in the column direction are connected to a common source line SL. Each gate of the memory transistors MTr1 to MTr8 is connected to word lines WL1 to 8 respectively. Gates of the back gate transistors BTr are connected to a back gate line BG in common. A gate of the source side selection transistor SSTr is connected to a source side selection gate line SGS, and a gate of the drain side selection transistor SDTr is connected to a drain side selection gate line SGD.

Memory Cell

Figure 3:
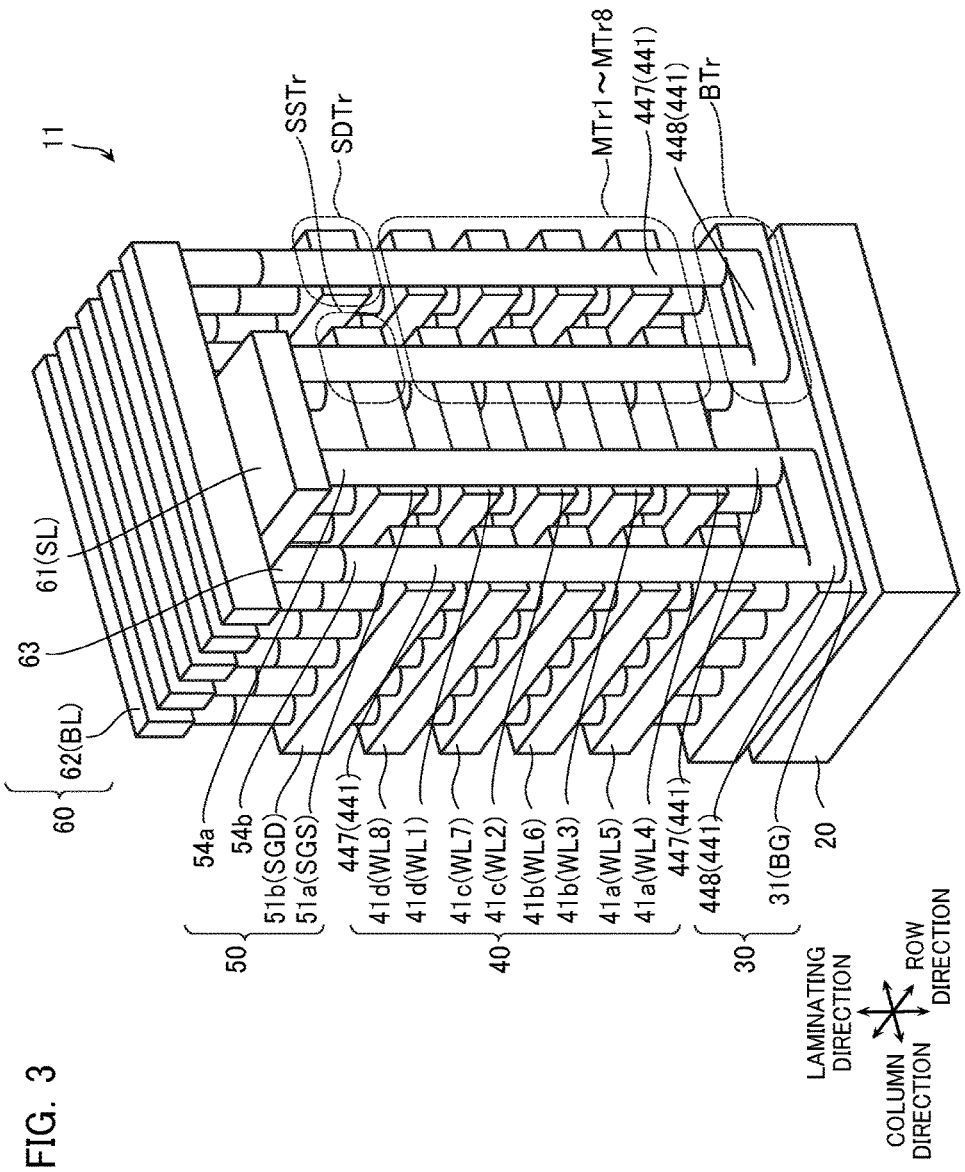
FIG. 3 is a schematic perspective view illustrating apart of the configuration of the semiconductor memory device.
Figure 4A:
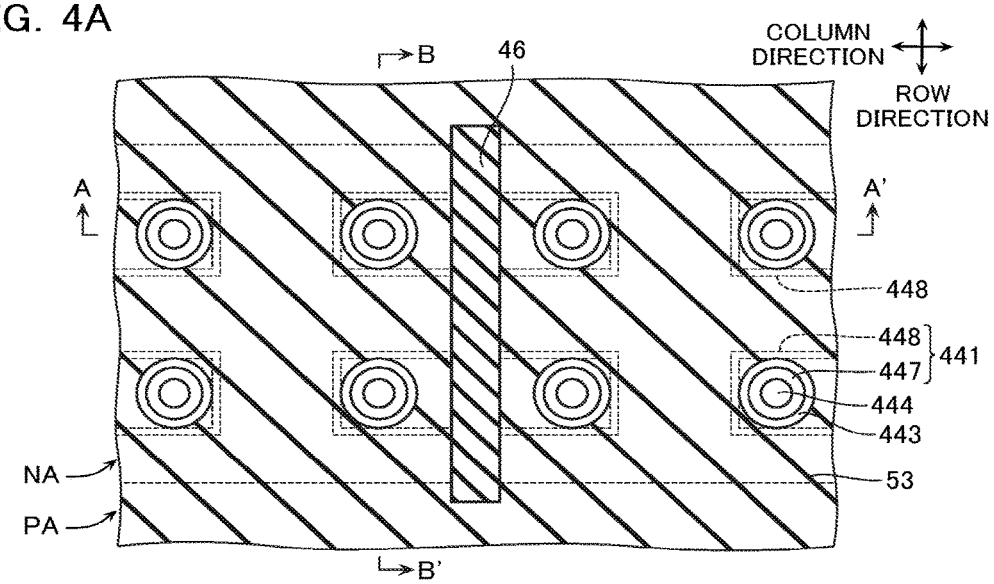
FIG. 4A is a schematic plan view illustrating a part of the configuration of the semiconductor memory device.
Figure 4B:
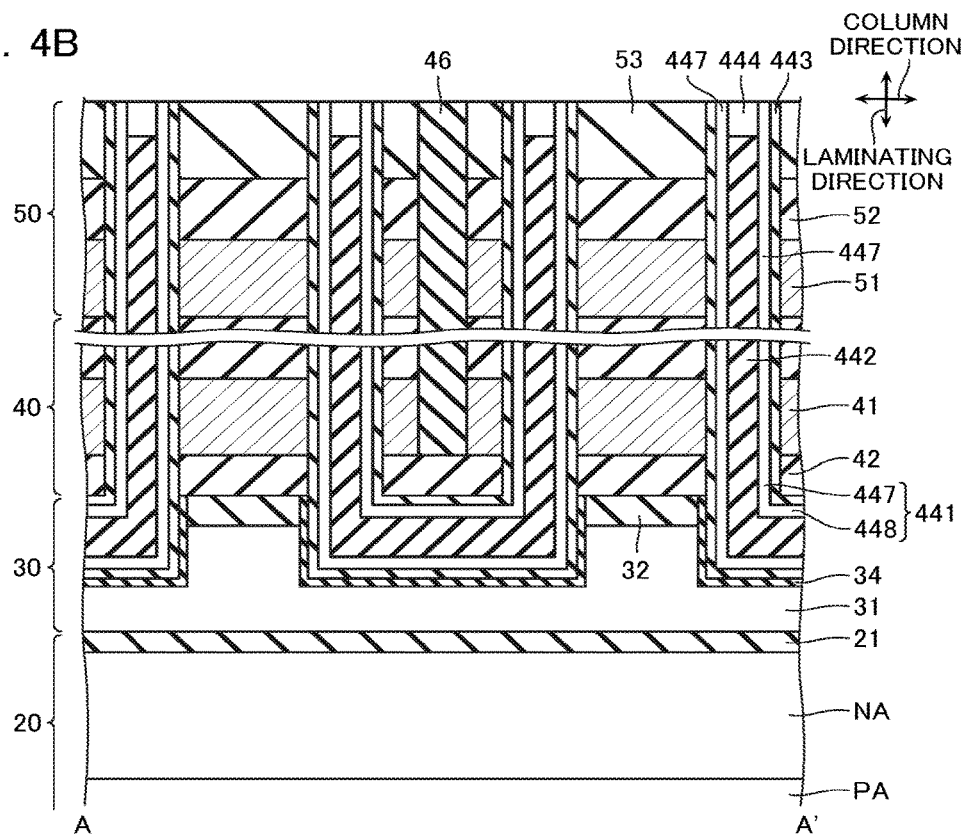
FIG. 4B is a cross-sectional view illustrating a part of the configuration of the semiconductor memory device, and corresponds to a cross-sectional view taken along a line A-A' in FIG. 4A.
Figure 4C:
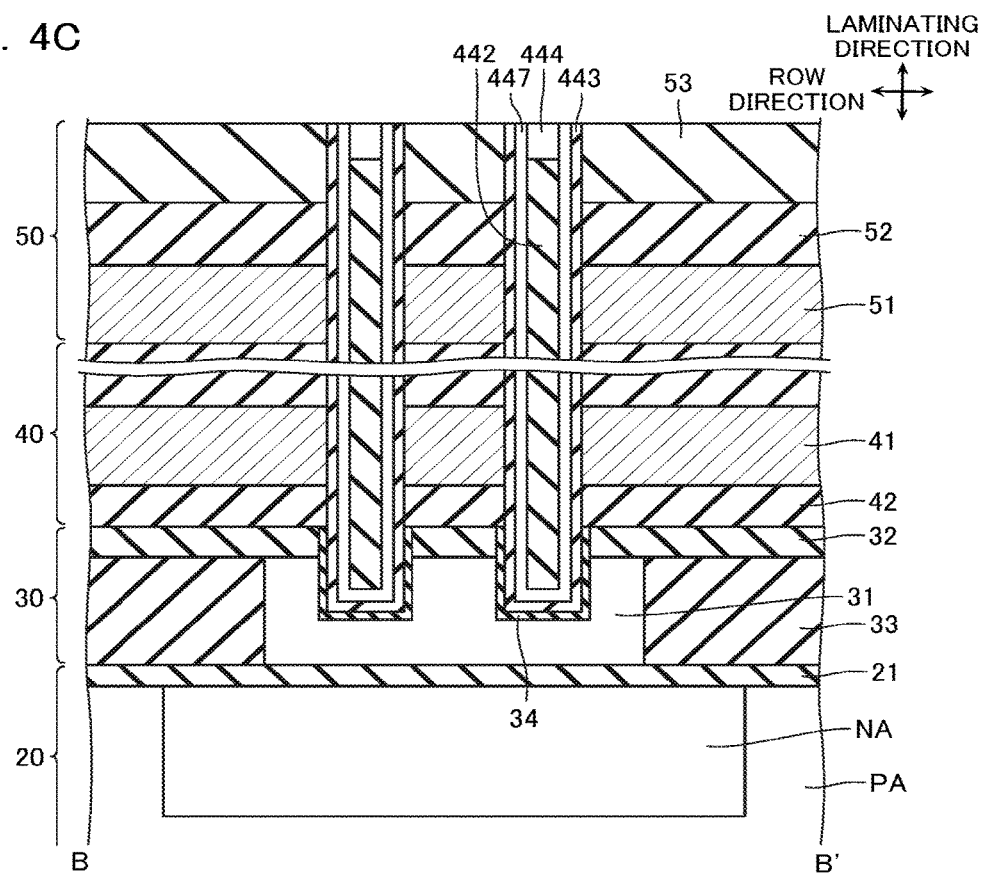
FIG. 4C is a cross-sectional view illustrating a part of the configuration of the semiconductor memory device, and corresponds to a cross-sectional view taken along a line B-B' in FIG. 4A.

FIG. 3 is a perspective view illustrating a part of the memory cell array 11. FIG. 4A is a plan view illustrating a part of the memory cell array 11. FIG. 4B is a cross-sectional view taken along a line A-A' in FIG. 4A. FIG. 4C is a cross-sectional view taken along a line B-B' in FIG. 4A. The following firstly describes a schematic configuration of the memory cell array 11 with reference to FIG. 3, mainly a memory cell included in the memory cell array 11 especially, then, in further details with reference to FIG. 4A to FIG. 4C.

While the following describes an example where the semiconductor memory device has a Metal/Oxide/Nitride/Oxide/Silicon structure (MONOS structure) or a Silicon/Oxide/Nitride/Oxide/Silicon structure (SONOS structure), the semiconductor memory device may have a floating gate structure.

As shown in FIG. 3, a back gate layer 30, a memory layer 40, a selection transistor layer 50, and a wiring layer 60 are sequentially laminated on a substrate 20 to be disposed. The back gate layer 30 functions as the back gate transistor BTr. The memory layer 40 functions as the memory transistors MTr1 to MTr8. The selection transistor layer 50 functions as the drain side selection transistor SDTr and the source side selection transistor SSTr. The wiring layer 60 functions as the source line SL and the bit line BL.

The substrate 20 is constituted of a semiconductor such as silicon. The substrate 20 includes a p type semiconductor region PA that includes p type impurities such as boron (B) and an n type semiconductor region NA that includes n type impurities such as phosphorus (P) or arsenic (As). This will be described later in detail.

As shown in FIG. 3, the back gate layer 30 includes a back gate conducting layer 31. The back gate conducting layer 31 functions as the gate of the back gate line BG and the back gate transistor BTr. The back gate conducting layer 31 is two-dimensionally disposed in the row direction and the column direction, which are parallel to the surface of the substrate 20, expanding in a plate shape. The back gate conducting layer 31 is constituted of a conducting layer, for example, polysilicon. The back gate conducting layer 31 may be constituted of metal, for example, tungsten.

The memory layer 40 is disposed on the upper layer of the back gate layer 30. The memory layer 40 includes a plurality layers (four layers in FIG. 3) of word line conducting layers 41a to 41d. The word line conducting layers 41 extend in the row direction, and are laminated with a predetermined pitch in the column direction. The word line conducting layer 41a functions as the gate of the word line WL4 and the memory transistor MTr4. The word line conducting layer 41a also functions as the gate of the word line WL5 and the memory transistor MTr5. Similarly, the word line conducting layers 41b to 41d respectively function as the gate of the word lines WL3 to WL1, and WL6 to WL8. And the word line conducting layers 41b to 41d respectively function as the gate of the memory transistors MTr3 to MTr1, and MTr6 to MTr8.

The word line conducting layers 41a to 41d are conducting layers constituted of, for example, polysilicon. The word line conducting layers 41a to 41d may be conducting layers constituted of metal, for example, tungsten.

The back gate layer 30 and the memory layer 40 include a memory semiconductor layer 441. The memory semiconductor layer 441 is constituted of a pair of columnar portions 447 and a connecting portion 448. The columnar portions 447 are disposed on the back gate layer 30. The columnar portions 447 are, in this embodiment, columnar-shaped disposed on the substrate 20 extending in a direction, for example, perpendicular to the substrate surface, and a plurality of columnar portions 447 are disposed along the column direction and the row direction. The connecting portion 448 connects the lower ends of the pair of the columnar portions 447 adjacent to one another in the column direction. This provides the memory semiconductor layer 441 with a U shape viewed from the row direction. The memory semiconductor layer 441 functions as the body (channel) of the memory string MS (memory transistors MTr1 to MTr8) and the back gate transistor BTr. Hereinafter, descriptions will be given with a direction in which the columnar portion 447 extends (in this embodiment, a direction perpendicular to the surface of the substrate 20) as a laminating direction.

The memory semiconductor layer 441 is a semiconductor constituted of, for example, polysilicon. That is, the columnar portion 447 and the connecting portion 448 can be constituted of the identical material.

The selection transistor layer 50 is disposed on the upper layer of the memory layer 40. That is, the selection transistor layer 50 includes a source side conducting layer 51a and a source side semiconductor layer 54a, and a drain side conducting layer 51b and a drain side semiconductor layer 54b on an upward side of the columnar portion 447 that opposes to the connecting portion 448 (that is, a side apart from the substrate surface). The source side conducting layer 51a functions as the source side selection gate line SGS. The drain side conducting layer 51b functions as the drain side selection gate line SGD. The source side semiconductor layer 54*a* functions as the channel of the source side selection transistor SSTr. The drain side semiconductor layer 54*b* functions as the channel of the drain side selection transistor SDTr.

The source side conducting layer 51*a* and the drain side conducting layer 51*b* can be constituted of a conductive body such as polysilicon or metal such as tungsten as well as the word line conducting layer 41. The source side semiconductor layer 54*a* and the drain side semiconductor layer 54*b* can be constituted of a semiconductor such as polysilicon as well as the memory semiconductor layer 441.

The wiring layer 60 is disposed on the upper layer of the selection transistor layer 50. The wiring layer 60 includes a conducting layer 61, a conducting layer 62, and a conducting layer 63. The conducting layer 61 is connected to the memory semiconductor layer 441 of the source side selection gate line SGS side, and functions as the source line SL. The conducting layer 62 is connected to the memory semiconductor layer 441 of the drain side selection gate line SGD side via the conducting layer 63, and functions as the bit line BL. The conducting layer 63 functions as a contact to connected the conducting layer 62 to the memory semiconductor layer 441. The conducting layer 61, the conducting layer 62 and the conducting layer 63 can be constituted of a layer with conductive property, for example, polysilicon or tungsten.

The following describes the configuration of the memory cell array 11 in further details with reference to FIG. 4A to FIG. 4C. FIG. 4A to FIG. 4C omit illustrations of a part of the selection transistor layer 50 and the wiring layer 60.

As shown in FIG. 4A, cross-sectional surfaces of the columnar portions 447 of the memory semiconductor layers 441 are disposed in an array shape in the column direction and the row direction. The memory semiconductor layer 441 includes an insulating layer 46 between the pair of the columnar portions 447. The insulating layer 46 insulates the memory cells of the right and left columnar portions 447 one another. The inside of the memory semiconductor layer 441 is filled with a core oxide film 442. The core oxide film 442 is constituted of an insulator, for example, silicon nitride, silicon oxide, or aluminum oxide.

In the embodiment, the substrate 20 includes the n type semiconductor region NA that contains n type impurities and the p type semiconductor region PA that contains p type impurities. As shown in FIG. 4A to FIG. 4C, the n type semiconductor region NA is disposed on the surface of the substrate 20. The p type semiconductor region PA covers the row directional sides and the bottom surface of the n type semiconductor region NA.

The back gate layer 30 is disposed on the substrate 20 via a gate insulating layer 21. The memory layer 40 is disposed on the back gate layer 30 via a gate insulating layer 32. The gate insulating layer 21 and the gate insulating layer 32 can be constituted of an insulator such as silicon oxide.

As shown in FIG. 4A to FIG. 4C, the back gate layer 30 and the memory layer 40 include a memory film 443 that covers the memory semiconductor layer 441. The memory film 443 can be constituted of a laminated body that includes a tunnel insulating layer, an electric charge accumulating layer that covers the tunnel insulating layer, and a block insulating layer that covers the electric charge accumulating layer. These layers are disposed from the center of the memory semiconductor layer 441 toward the outside word line conducting layer 41. The electric charge accumulating layer is configured to accumulate the electric charge as the data of each memory cell.

The tunnel insulating layer and the block insulating layer can be constituted of insulating material, for example, oxide and oxynitride.

The electric charge accumulating layer can be constituted of, for example, silicon nitride ($Si_3N_4$).

As shown in FIG. 4B, the insulating layer 46 divides the word line conducting layer 41 near the one columnar portion 447 of the pair of the columnar portions 447, which are connected to one another by the connecting portion 448, and the word line conducting layer 41 near the other columnar portion 447 in the column direction. As shown in FIG. 4B and FIG. 4C, a gate insulating layer 34 is disposed between the lower end of the memory semiconductor layer 441 (the connecting portion 448) and the back gate conducting layer 31. The gate insulating layer 34 can be constituted of an insulator, for example, silicon oxide ($SiO_2$) or silicon nitride ($Si_3N_4$).

An interlayer insulating layer 42 is disposed between the word line conducting layers 41. The interlayer insulating layer 42 is constituted of an insulating layer, for example, silicon oxide.

Here, in the three-dimensional semiconductor memory device with the configuration where the lower ends of the pair of the columnar portions 447 adjacent to one another in the column direction are connected by the connecting portion 448, such as described in the embodiment, the back gate conducting layer 31 (the back gate BG) covers the side surfaces in the column direction and the row direction of the connecting portion 448 via the gate insulating layer 34 to form the channel by inverting the connecting portion 448 constituted of the semiconductor. Applying a predetermined voltage to the back gate BG causes the pair of the columnar portions 447 of the memory semiconductor layer 441 adjacent to one another in the column direction to be electrically conducted via the gate insulating layer 34.

A CMOS circuit (not illustrated) is disposed on the substrate 20 for the device operation, and the substrate 20 is biased to 0V during the operation. Then, when the predetermined voltage is applied to the back gate BG, a capacitance corresponding to the film type and the film thickness of the gate insulating layer 21 disposed between the back gate BG and the substrate 20 is generated. This charge and discharge possibly delay the operating time.

Therefore, the n type semiconductor region NA that contains n type impurities is formed on the lower portion of the back gate BG in a floating state with respect to the substrate 20 that uses p type to form NMOS (not illustrated). That is, the n type semiconductor region NA is electrically independent of the back gate BG. This structure forms a depletion layer capacitance between the n type impurities included in the n type semiconductor region NA and the substrate 20 of the p type in series with respect to the capacitance of the gate insulating layer 21 between the substrate 20 and the back gate BG. This ensures to reduce the capacitance of the back gate BG.

In processing memory holes to form the memory semiconductor layers 441, etching is sometimes performed for a long time to adjust the size of the inner diameters of the upper portion and the lower portion of the memory hole. This sometimes causes the memory hole to reach the substrate 20. To the formed memory semiconductor layers 441 (the channel), a voltage for the operations of erasure, writing, and reading of data is applied, and this voltage is also applied to a channel portion (the memory semiconductor layer 441) that has reached the substrate 20. This generates the capacitance corresponding to the film type and the film thickness of the memory film 443 of the memory semiconductor layer 441 between the memory semiconductor layer 441 and the substrate 20. However, in the embodiment, the n type semiconductor region NA is disposed on the substrate 20 below the memory semiconductor layer 441. This provides the effect to reduce the capacitance and ensures the improvement of the operation speed.

In the embodiment, as shown in FIG. 4A to FIG. 4C, the n type semiconductor region NA is disposed extending over the plurality of the memory semiconductor layers 441 disposed along the column direction and the row direction. However, as obvious in the above description, it is only necessary for the n type semiconductor region NA to be disposed between the memory semiconductor layer 441 as the channel and the substrate 20. In other words, it is only necessary for then type semiconductor region NA to be disposed on a region on the substrate 20 opposing to the end portion of the columnar portion 447 in the substrate 20 side in the laminating direction, for example. The n type semiconductor region NA may be disposed on a region on the substrate 20 opposing to the end portion of the connecting portion 448 in the substrate 20 side in the laminating direction. The n type semiconductor region NA can be disposed divided by the memory semiconductor layers 441 disposed in the column direction and the row direction.

Manufacturing Method

Figure 14:
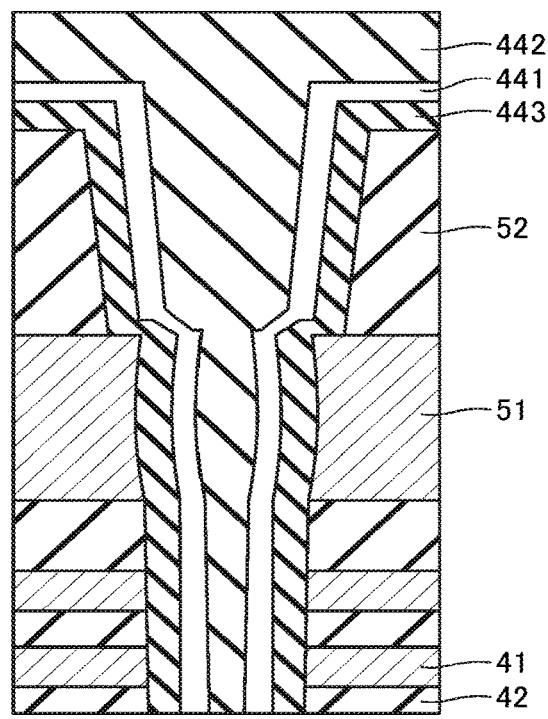
FIG. 14 to FIG. 16 are partially enlarged cross-sectional views illustrating the manufacturing method for the semiconductor memory device.
Figure 15:
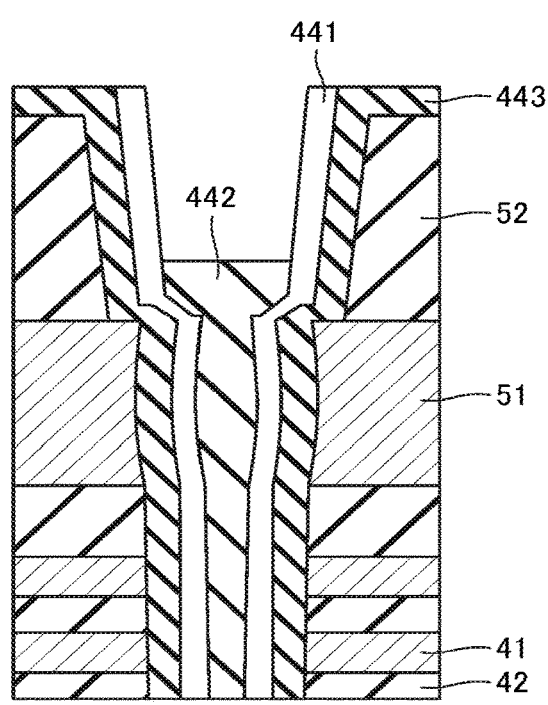
Figure 16:
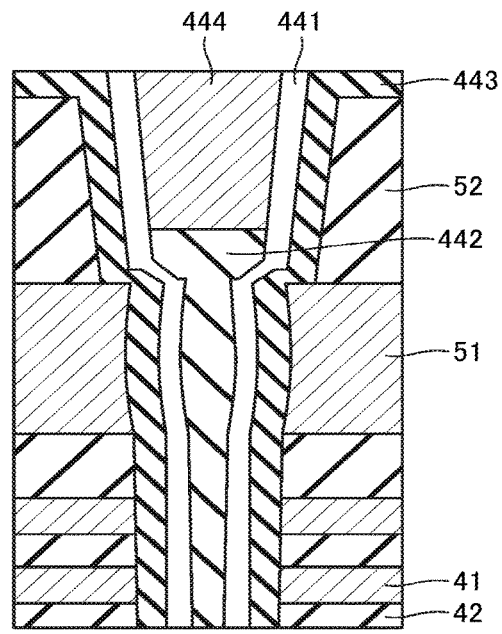

FIG. 5A to FIG. 13A are plan views illustrating a manufacturing method for the semiconductor memory device according to the first embodiment. FIG. 5B to FIG. 13B are cross-sectional views taken along the line A-A' in FIG. 5A to FIG. 13A, respectively. FIG. 5C to FIG. 13C are cross-sectional views taken along the line B-B' in FIG. 5A to FIG. 13A, respectively. FIG. 14 to FIG. 16 are partially enlarged cross-sectional views illustrating the manufacturing method for the semiconductor memory device.

Figure 5A:
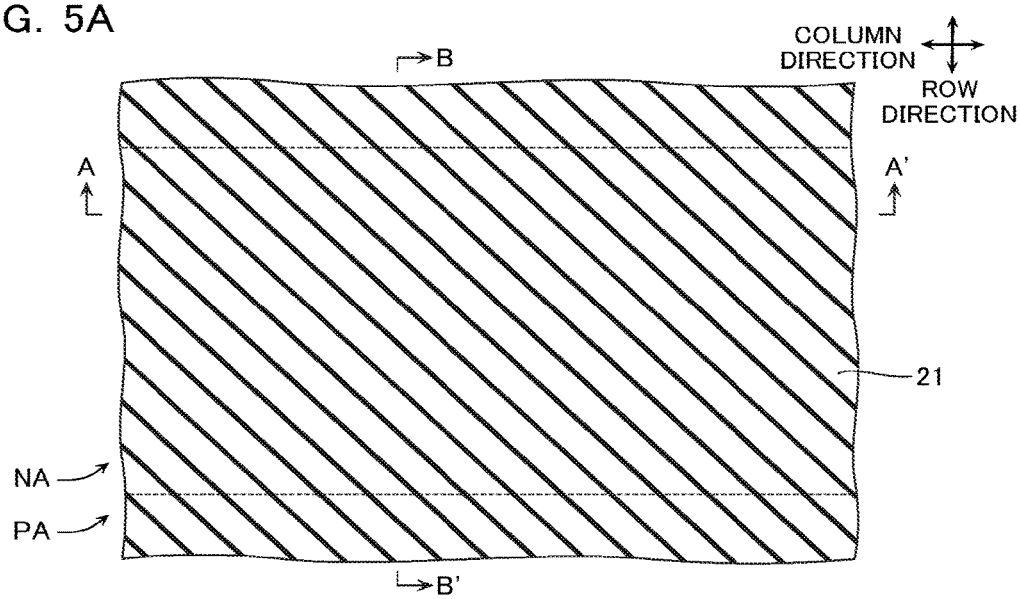
Figure 5B:
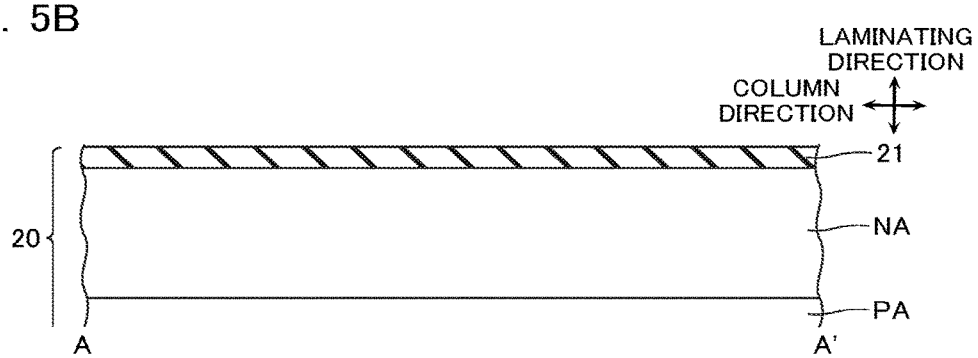
Figure 5C:
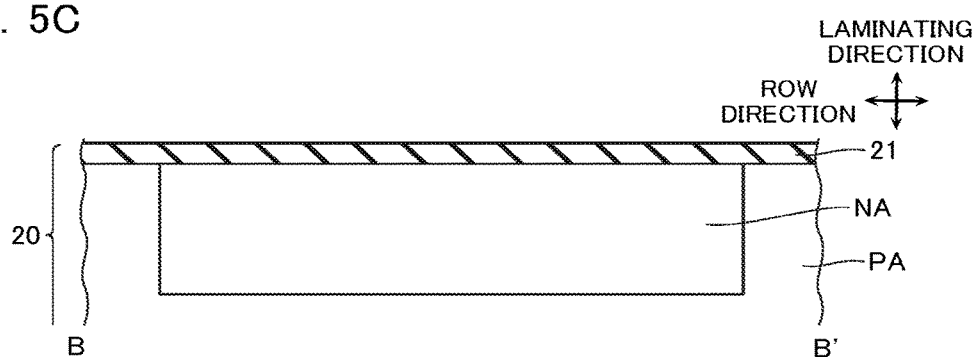

As shown in FIG. 5A to FIG. 5C, the p type impurities are doped on the substrate 20 to form the p type semiconductor region PA containing the p type impurities, and n type impurities are doped to form the n type semiconductor region NA containing the n type impurities. The p type semiconductor region PA can include boron (B), for example, as the p type impurities to be doped. The n type semiconductor region NA can include phosphorus (P) or arsenic (As), for example, as the n type impurities to be doped. The interlayer insulating layer 21 is formed on the substrate 20 by CVD method or similar method. The interlayer insulating layer 21 is constituted of, for example, silicon oxide ($SiO_2$).

Figure 6A:
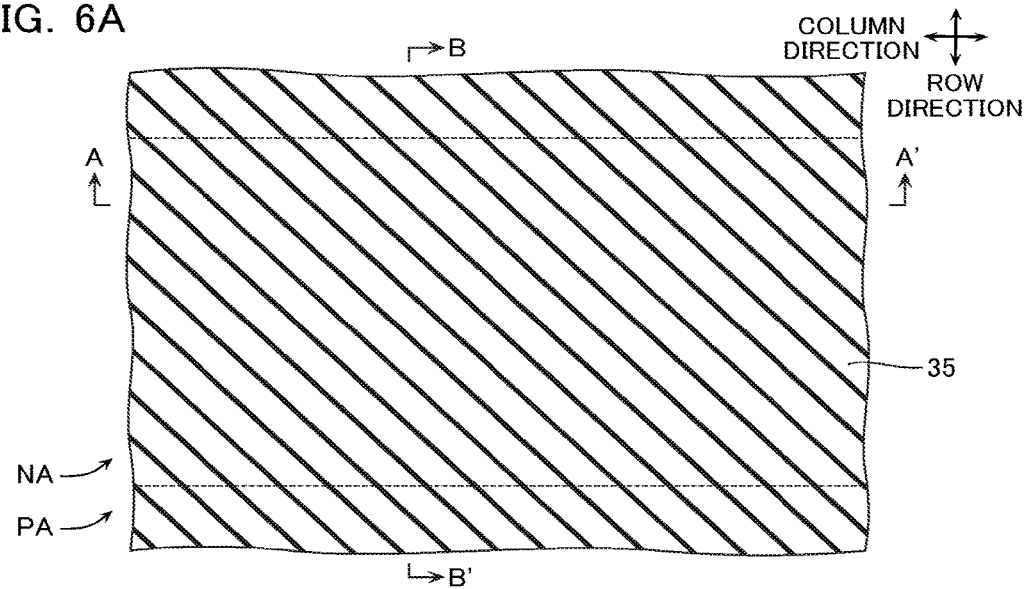
Figure 6B:
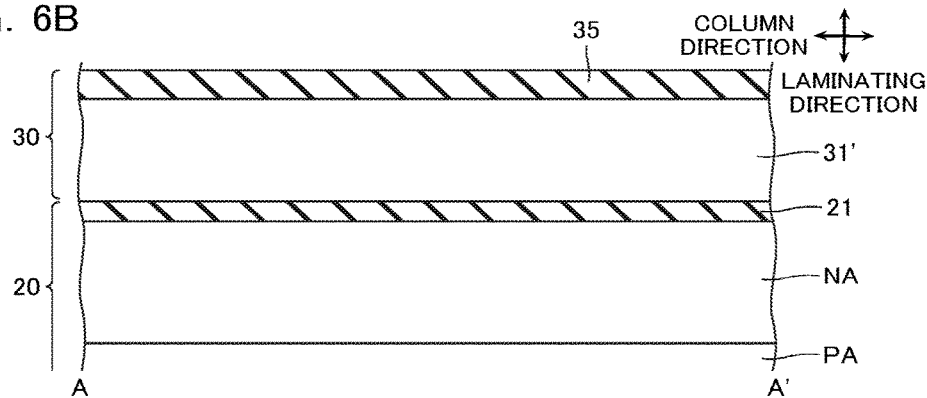
Figure 6C:
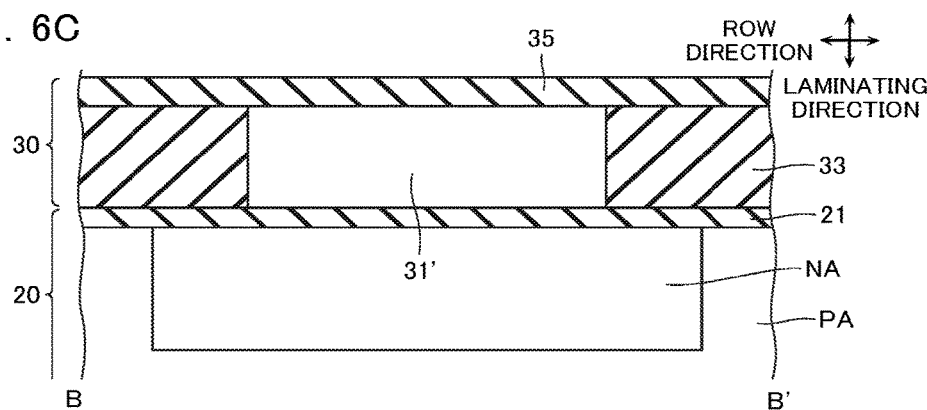

As shown in FIG. 6A to FIG. 6C, a silicon layer 31' and an interlayer insulating layer 33 are formed on the interlayer insulating layer 21. The silicon layer 31' is constituted of, for example, polycrystalline silicon. The interlayer insulating layer 33 is constituted of, for example, silicon oxide ($SiO_2$). Then, a stopper film 35 is formed on the top surfaces of the silicon layer 31' and the interlayer insulating layer 33, and the stopper film 35 is flattened by CMP method or similar method. The stopper film 35 is constituted of, for example, silicon nitride ($Si_3N_4$), and functions as a stopper in the process of etching performed later.

Figure 7A:
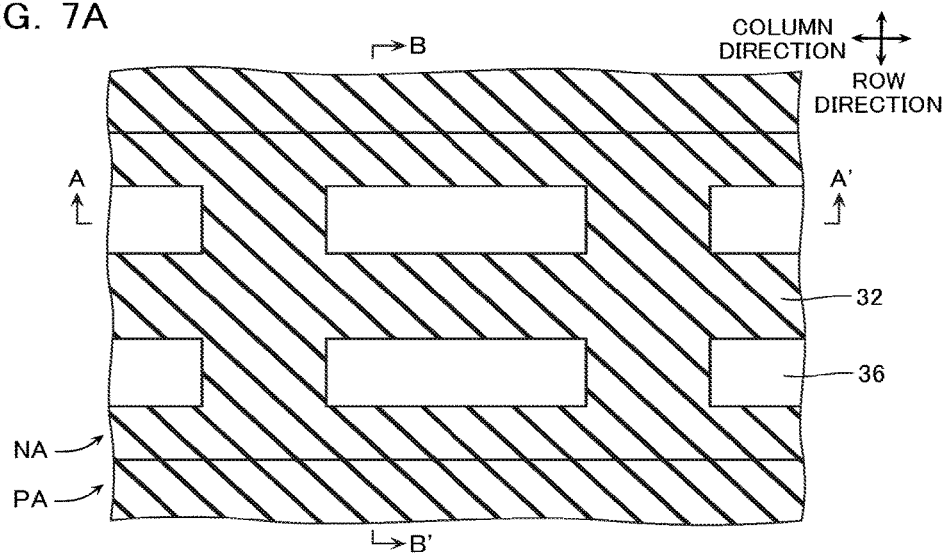
Figure 7B:
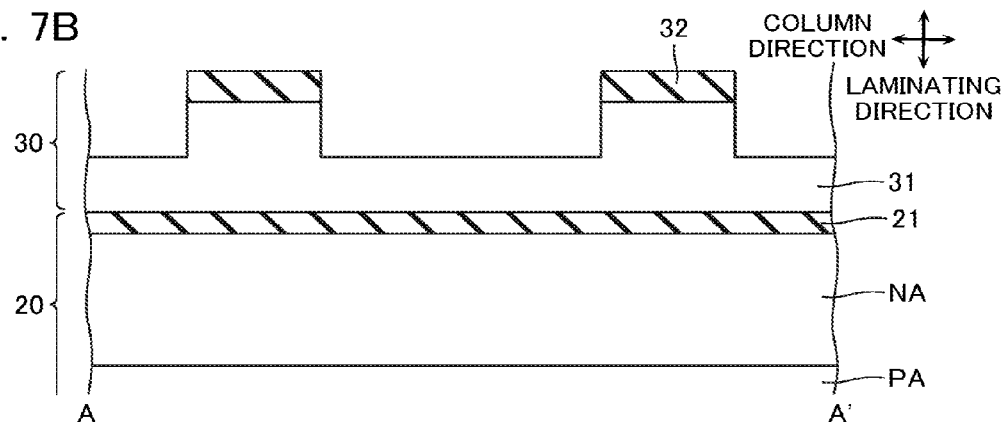
Figure 7C:
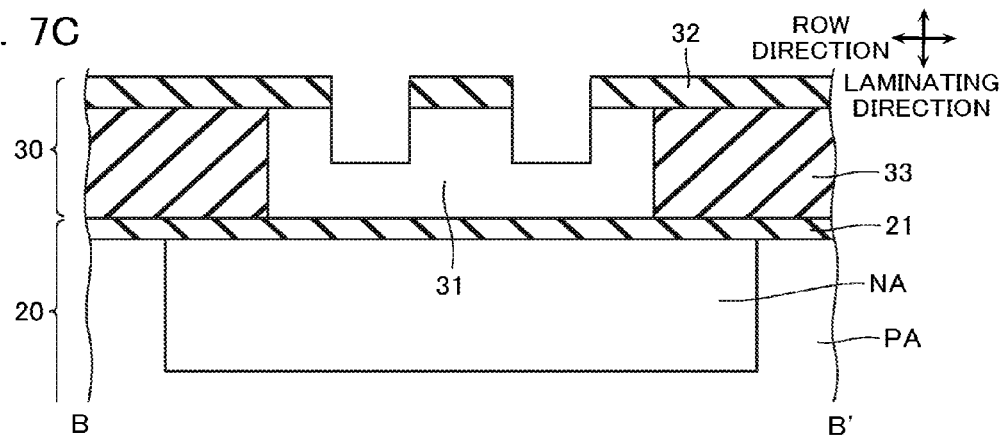

As shown in FIG. 7A to FIG. 7C, the etching is performed to a part of the interlayer insulating layer 33 and the stopper film 35 by RIE method or similar method. Next, LPCVD method or similar method is used to deposit the gate insulating layer 32 on the silicon layer 31 and the interlayer insulating layer 33. Then, RIE method is used to perform the etching to the gate insulating layer 32 and the silicon layer 31' by a desired depth with a photoresist (not illustrated) as a mask.

Figure 8A:
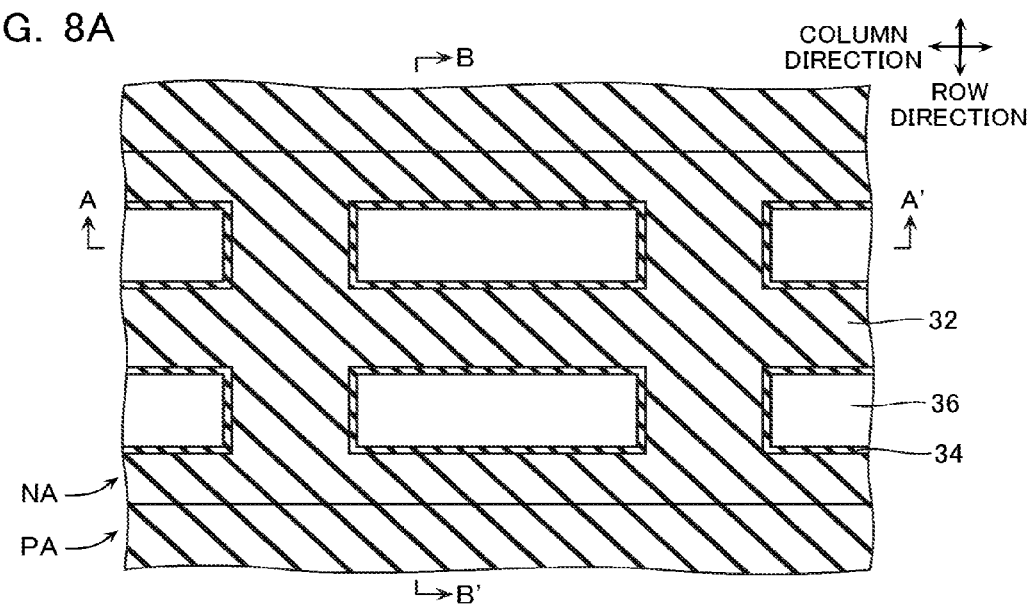
Figure 8B:
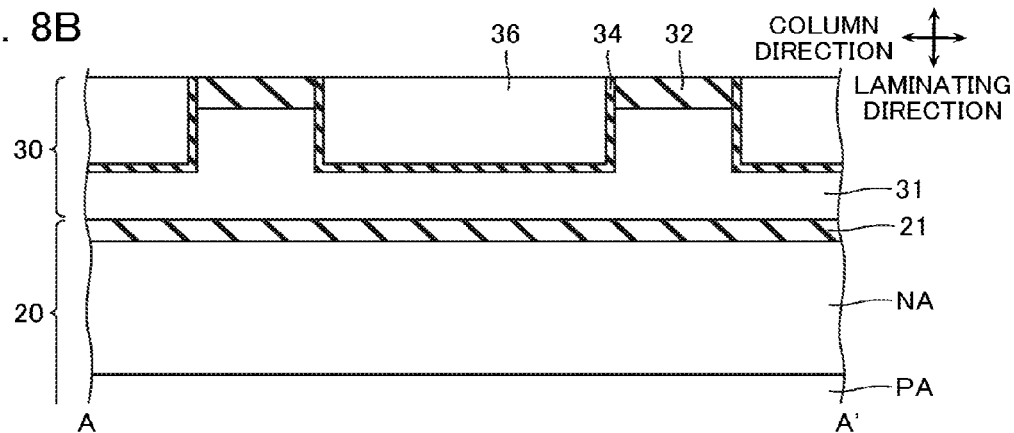
Figure 8C:
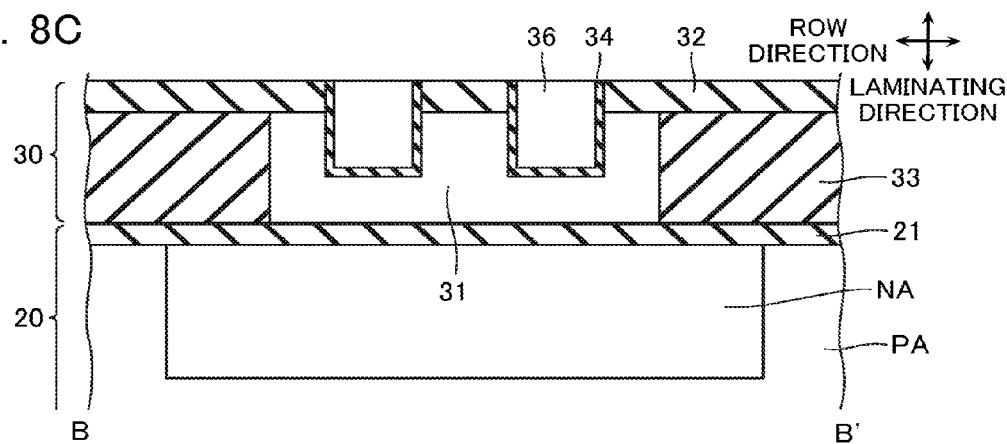

As shown in FIG. 8A to FIG. 8C, RTO (Rapid Thermal Oxidation) method or similar method is used to form the gate insulating layer 34 on the surface of the silicon layer 31'. Then, the LPCVD method or similar method is used to deposit a silicon layer 36. The silicon layer 36 can be constituted of, for example, amorphous silicon. Then, the RIE method or similar method is used to perform the etching to the silicon layer 36 with the gate insulating layer 32 as a stopper.

Figure 9A:
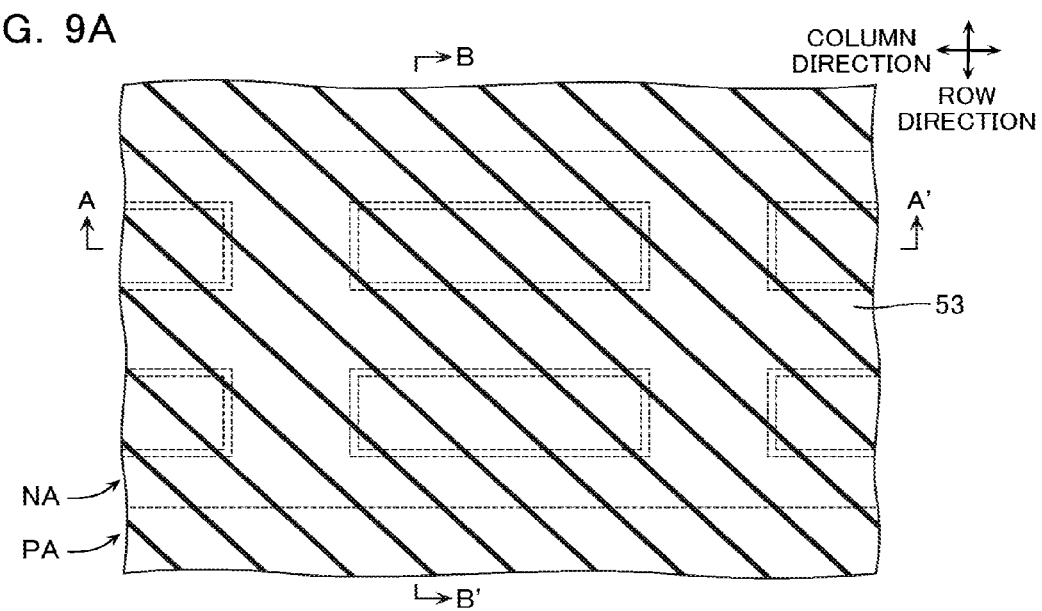
Figure 9B:
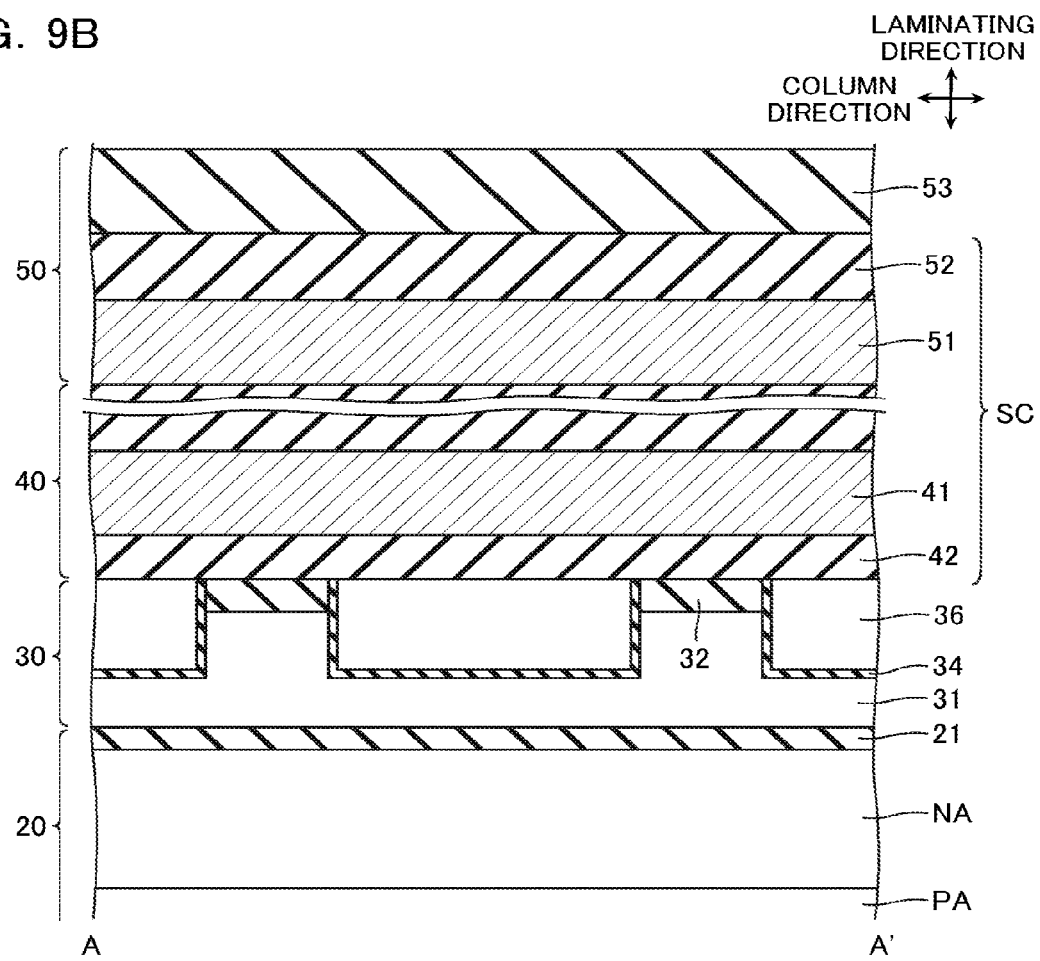
Figure 9C:
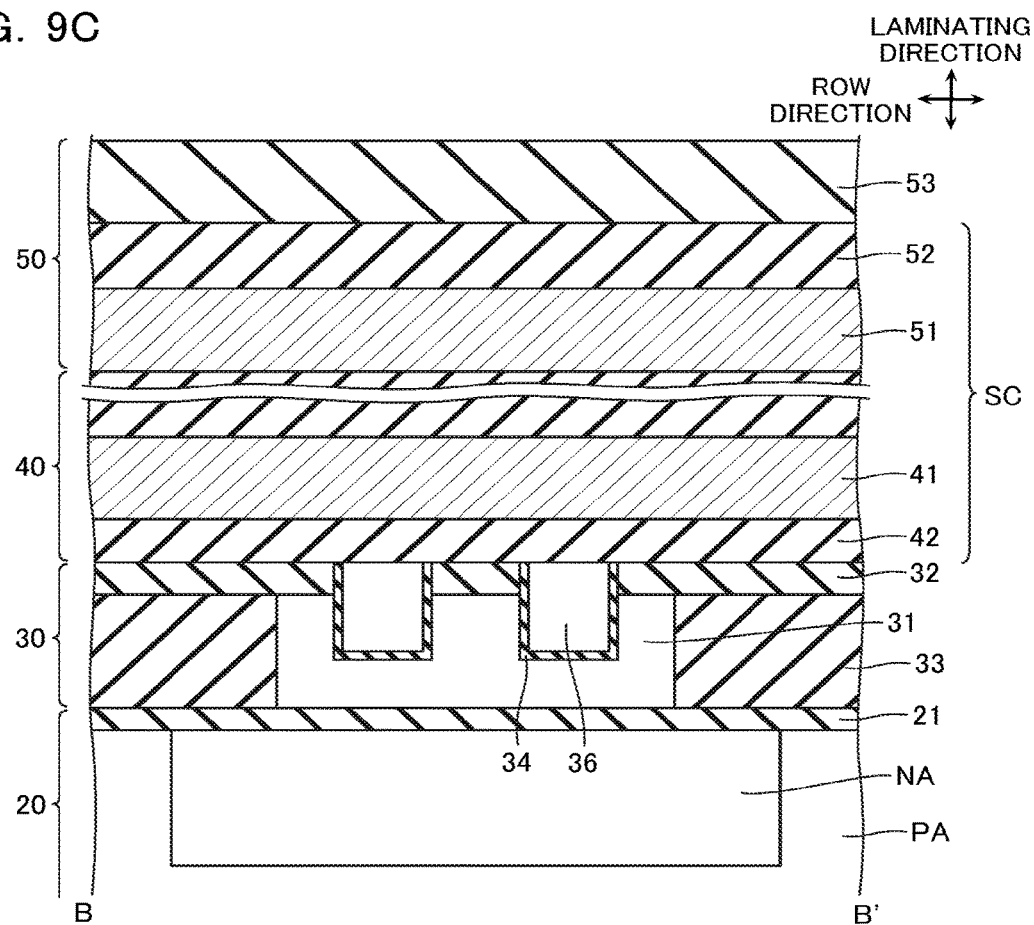

As shown in FIG. 9A to FIG. 9C, the LPCVD method or similar method is used to laminate a plurality of interlayer insulating layers 42 and the word line conducting layers 41 alternately. On the top surface of the word line conducting layer 41 on the uppermost layer, the source side (the drain side) conducting layer 51 and an interlayer insulating layer 52 are deposited. The interlayer insulating layers 42 and 52 are constituted of, for example, silicon oxide ($SiO_2$). Similarly, hereinafter, the part where these word line conducting layers 41 and the interlayer insulating layers 42 are repeatedly laminated will be referred to as a stack structure SC. Then, an oxide film 53 is formed on the top surface of the stack structure SC. The oxide film 53 is constituted of, for example, silicon oxide ($SiO_2$).

Figure 10A:
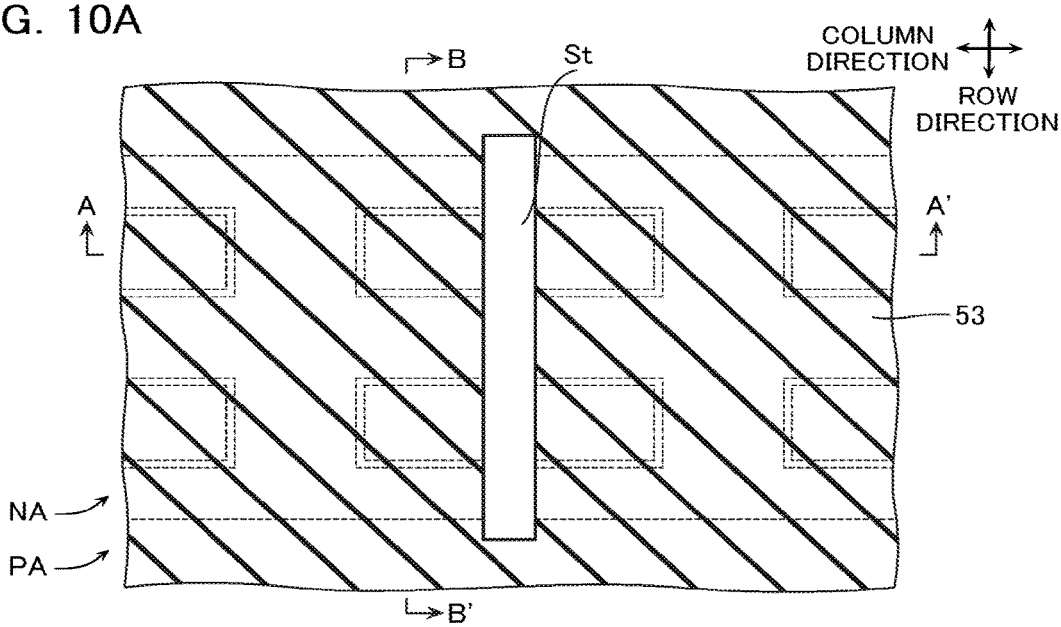
Figure 10B:
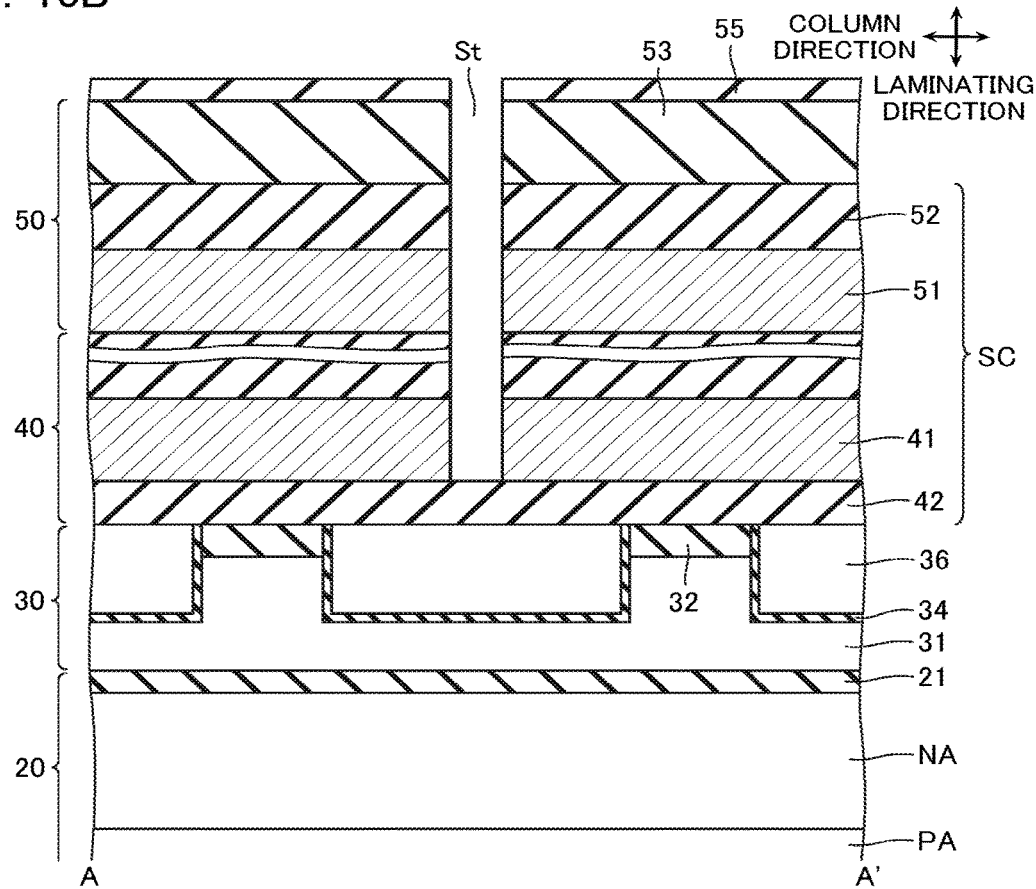
Figure 10C:
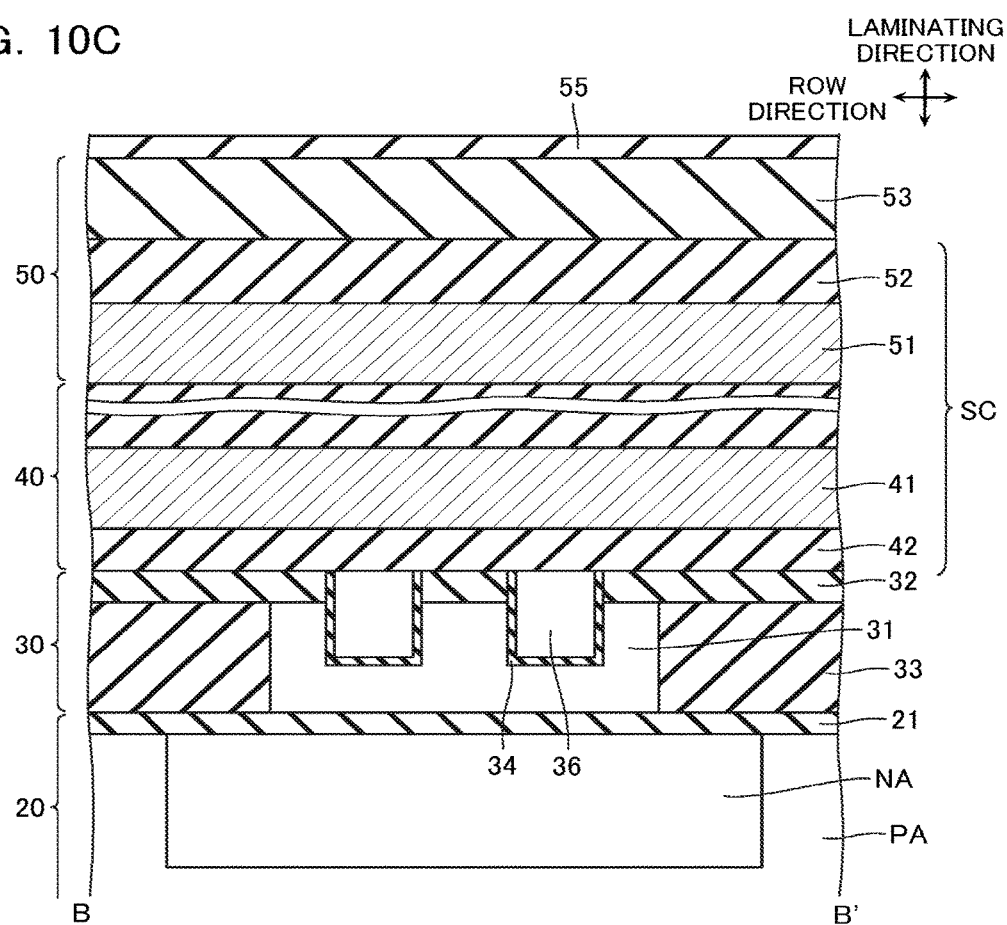

As shown in FIG. 10A to FIG. 10C, photolithography method or similar method is used to form a silicon oxide film 55 in a pattern corresponding to an element isolation portion (the insulating layer 46, described below) with a resist (not illustrated) as a mask. Subsequently, the resist (not illustrated) is peeled off by such as chemical liquid. Then, the RIE method or similar method is used to perform the etching to the stack structure SC with the silicon oxide film 55 as a mask to form a slit St.

Figure 11A:
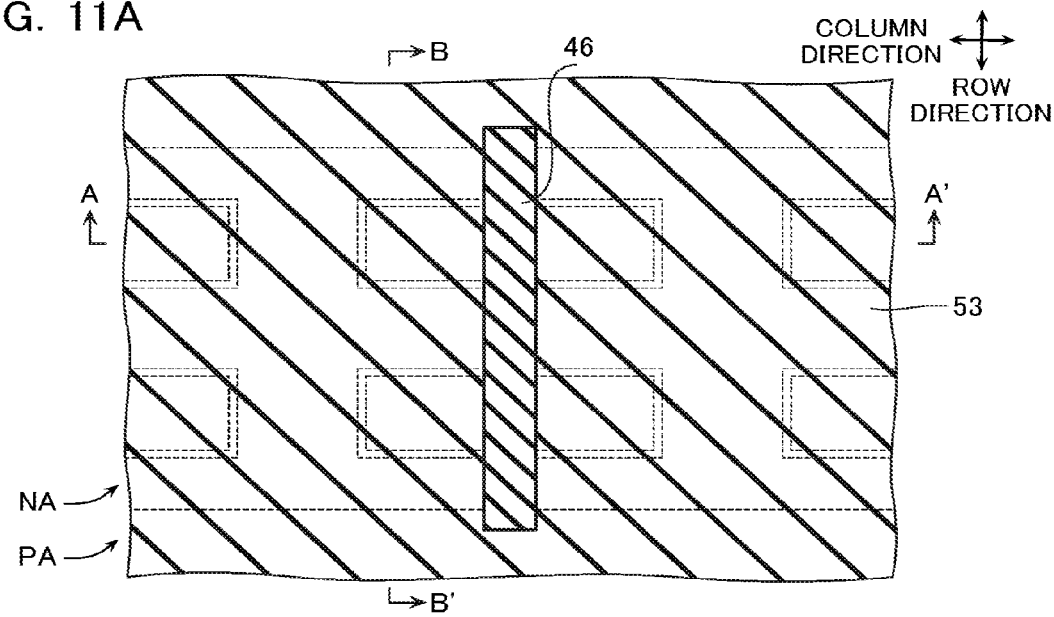
Figure 11B:
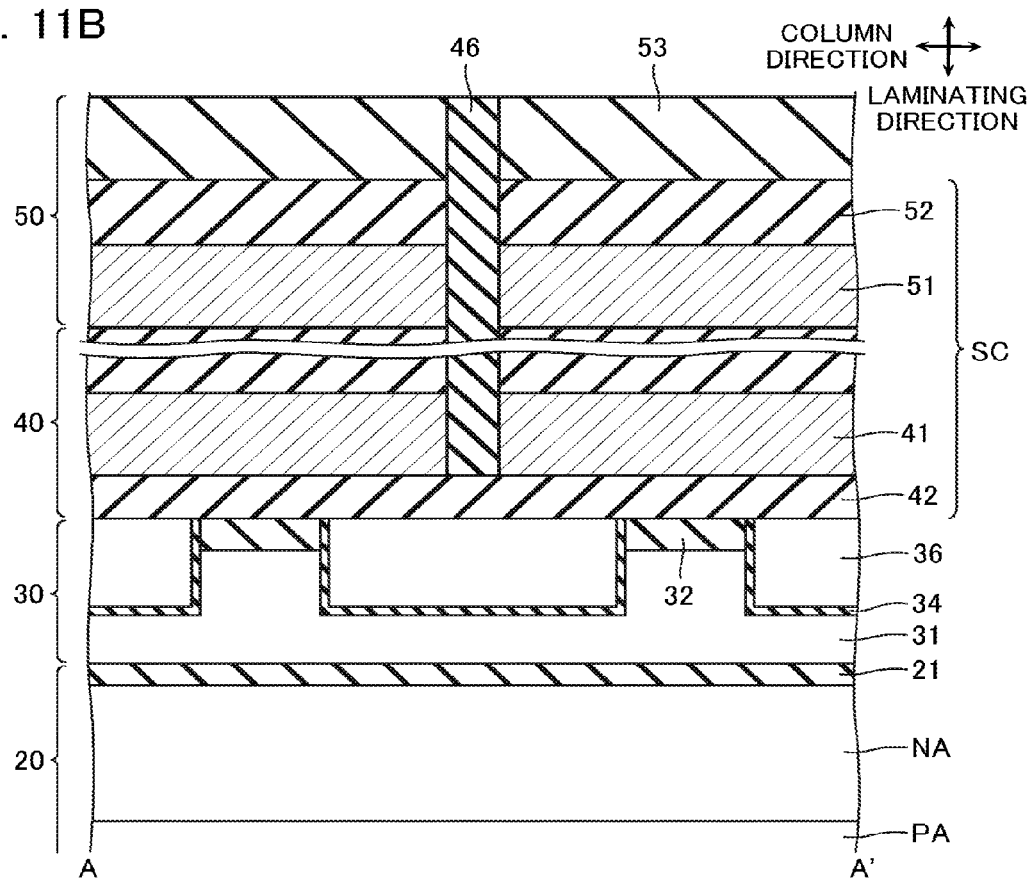

As shown in FIG. 11A to FIG. 11C, after VPC (Vapor Phase Cleaning) method or similar method is used to peel off the silicon oxide film 55, a silicon oxide film is formed in the slit St, and the RIE method or similar method is used to perform the etching to expose the top surface of the oxide film 53. This forms the insulating layer 46 to separate the pair of the columnar portions 447 adjacent to one another in the column direction.

Figure 12A:
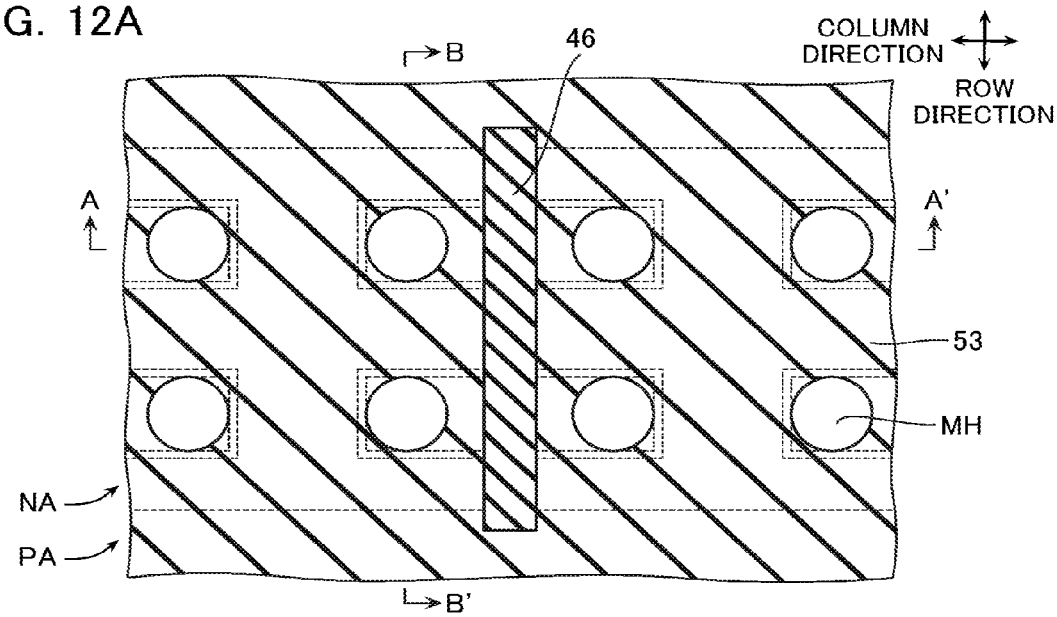
Figure 12B:
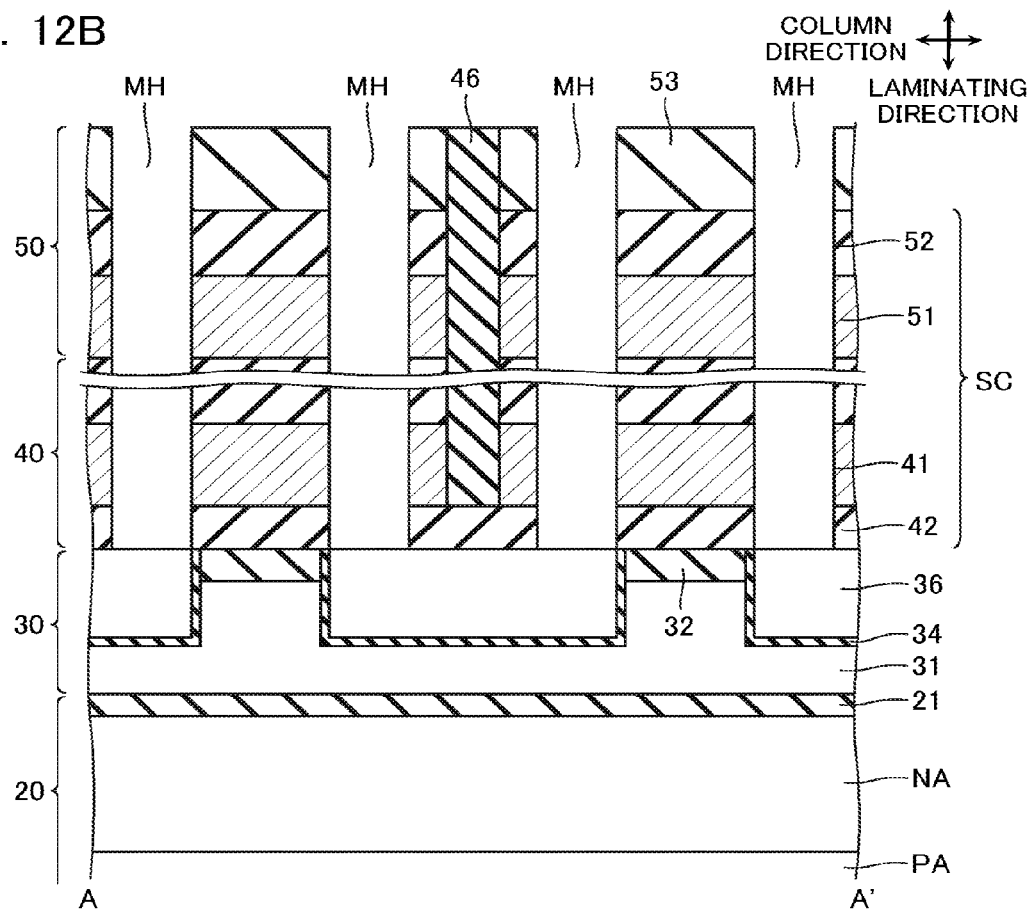
Figure 12C:
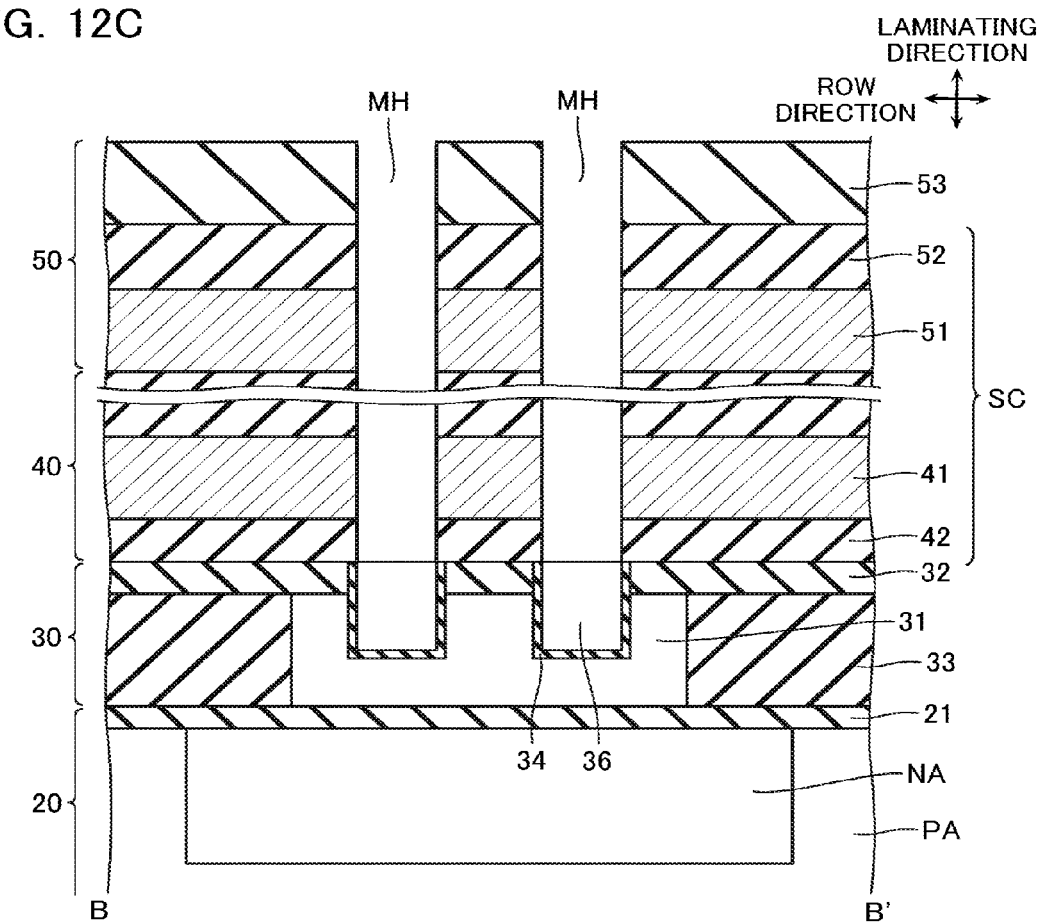

As shown in FIG. 12A to FIG. 12C, similarly to the forming process of the slit St described by referring to FIG. 11A to FIG. 11C, the photolithography method or similar method is used to form the oxide film (not illustrated) in the pattern corresponding to the memory hole MH with the resist (not illustrated) as the mask, and the RIE method is used to perform the etching to the stack structure SC with the oxide film formed in the above-described pattern as the mask. This forms the memory hole MH extending in the laminating direction.

Figure 13A:
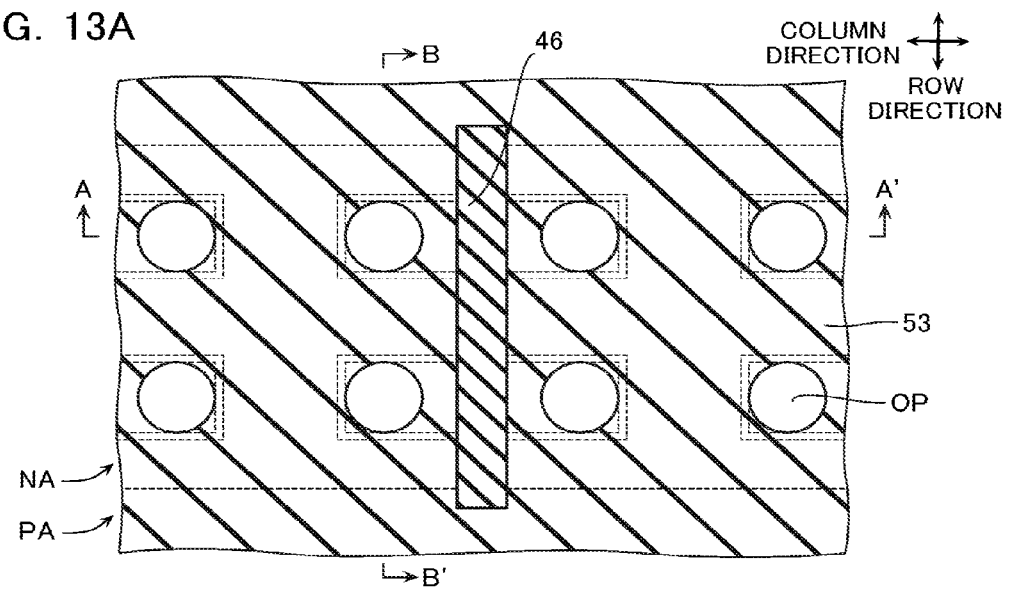
Figure 13B:
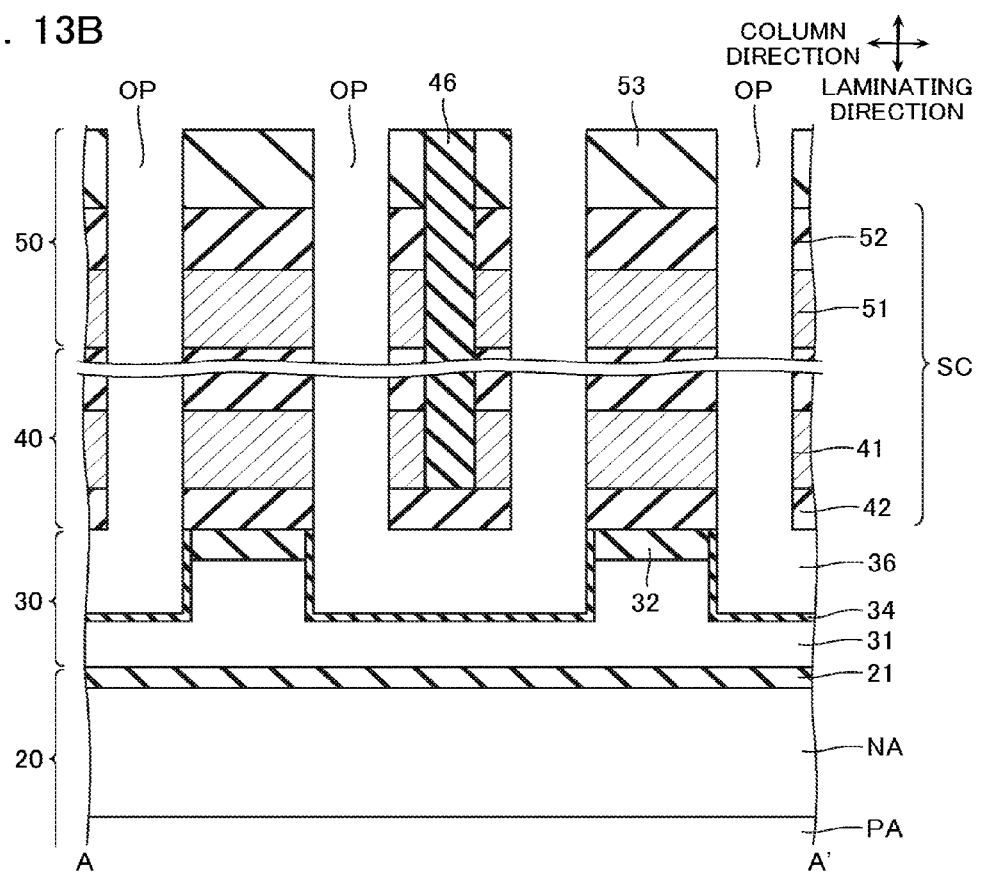
Figure 13C:
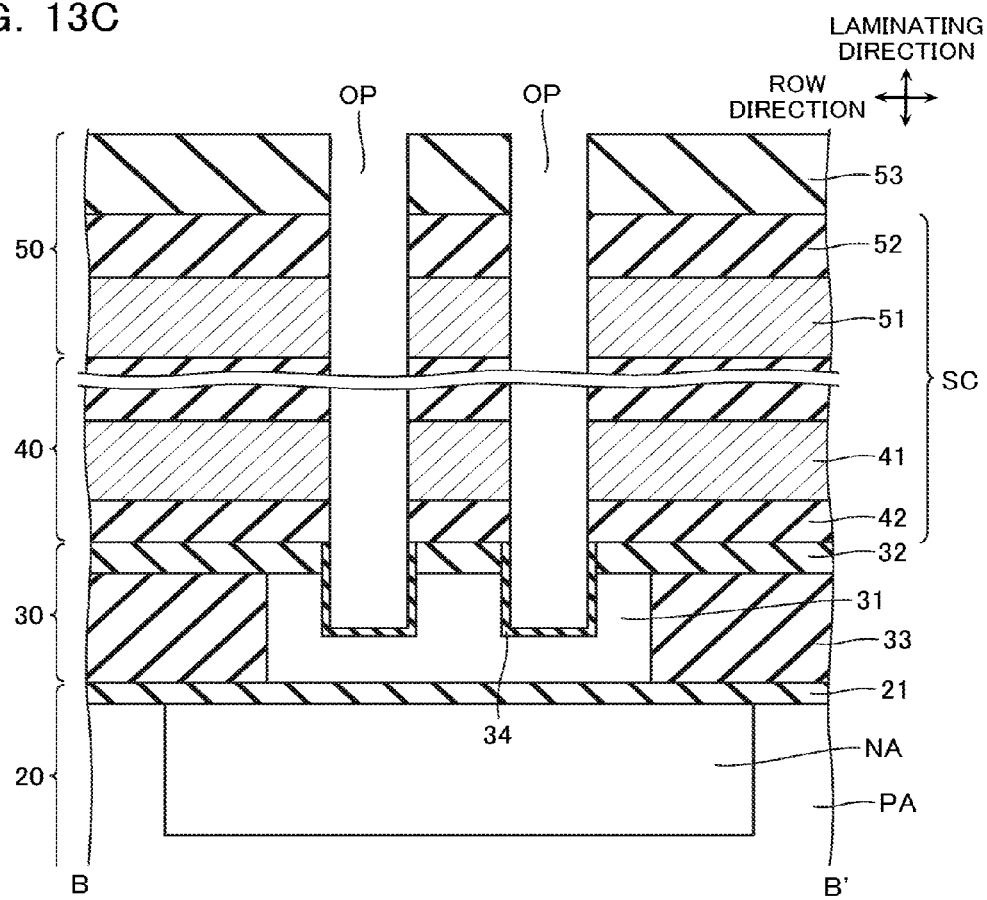

As shown in FIG. 13A-FIG. 13C, a chemical liquid to dissolve amorphous silicon, for example, trimethyl-2-hydroxyethyl ammonium hydroxide (TMY: [$(CH_3)_3N(CH_2CH_2OH)$]+$OH^-$) diluted with pure water, is used to remove the silicon layer 36 constituted of amorphous silicon. This forms an opening Op corresponding to the columnar portion 447 and the connecting portion 448 of the memory semiconductor layer 441.

The following describes a process for forming the memory semiconductor layer 441 on the opening Op by referring to FIG. 14 to FIG. 16. FIG. 14 to FIG. 16 are partially enlarged cross-sectional views illustrating a part including the above-described opening Op.

As shown in FIG. 14, the CVD method or similar method is used to sequentially form the block insulating layer, the electric charge accumulating layer, and the tunnel insulating layer in the opening Op form the word line conducting layer 41 toward the center of the memory hole MH. This forms the memory film 443. Next, the CVD method or similar method is used to form polycrystalline silicon. This forms the memory semiconductor layer 441 as the channel. Silicon oxide or similar compound is formed inside the memory semiconductor layer 441 to form the core insulating layer 442.

As shown in FIG. 15, under the condition where the etching can be selectively performed to the formed core insulating layer 442 alone, the RIE method or similar method is used to perform the etching to the core insulating layer 442. This leaves the memory film 443 with the appropriate film thickness inside the memory hole MH, and ensures the memory hole MH to be sealed by the memory film 443 that forms the memory cell, the memory semiconductor layer 441 as the channel, and the core insulating layer 442 remaining after the etching. This prevents the conductive film to contact the semiconductor in the memory semiconductor layer 441 that forms the channel from invading the memory hole MH.

As shown in FIG. 16, hydrofluoric acid treatment or similar method is used to remove a natural oxide film on the surface of the exposed memory semiconductor layer 441 to connect the memory semiconductor layer 441 to a metal wiring disposed on the upper portion of the memory semiconductor layer 441. Then, the CVD method or similar method is used to form a silicon layer 444 constituted of polycrystal including, for example, phosphorus (P) on the surface of the memory semiconductor layer 441. Finally, the silicon layer 444 is etch-backed to a height aligning with the top surface of the memory film 443 and the memory semiconductor layer 441. This provides the configuration illustrated in FIG. 4A to FIG. 4C.

Second Embodiment

Figure 17A:
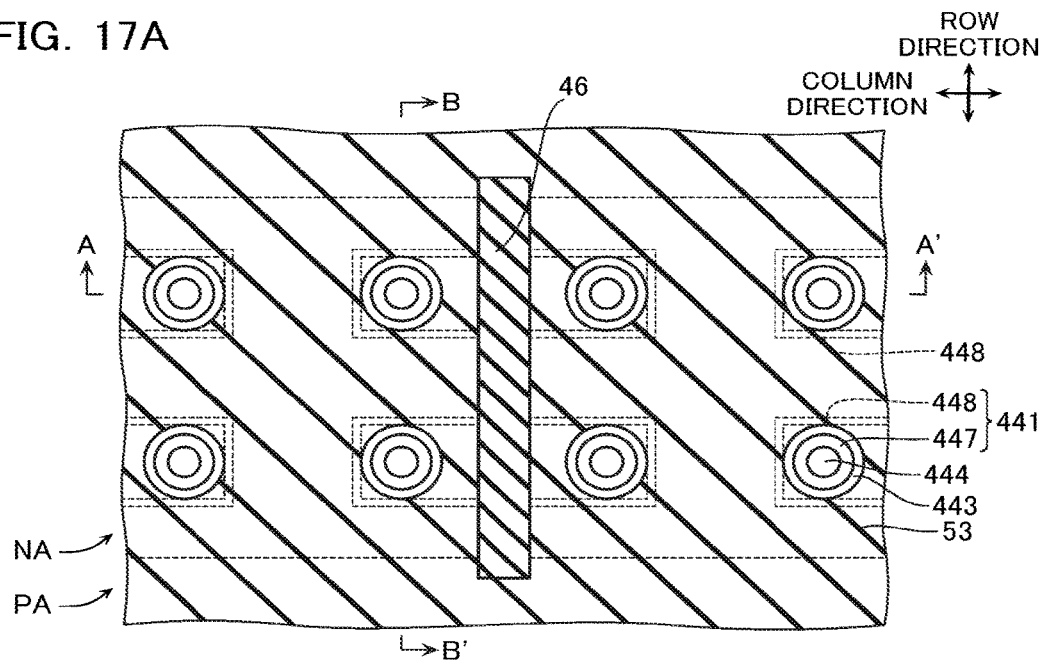
FIG. 17A is a schematic plan view illustrating a part of a configuration of a semiconductor memory device according to a second embodiment.
Figure 17B:
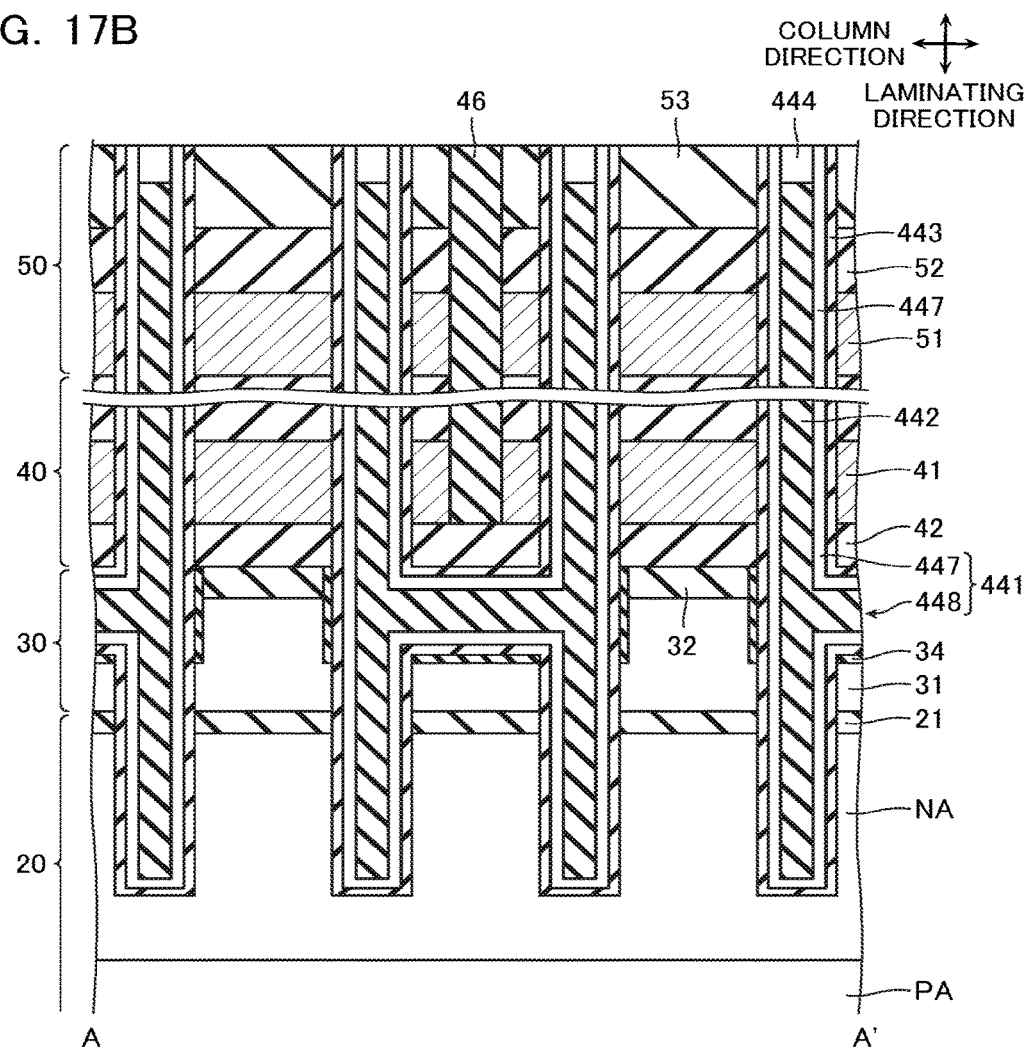
FIG. 17B is a cross-sectional view illustrating a part of the configuration of the semiconductor memory device, and corresponds to a cross-sectional view taken along a line A-A' in FIG. 17A.
Figure 17C:
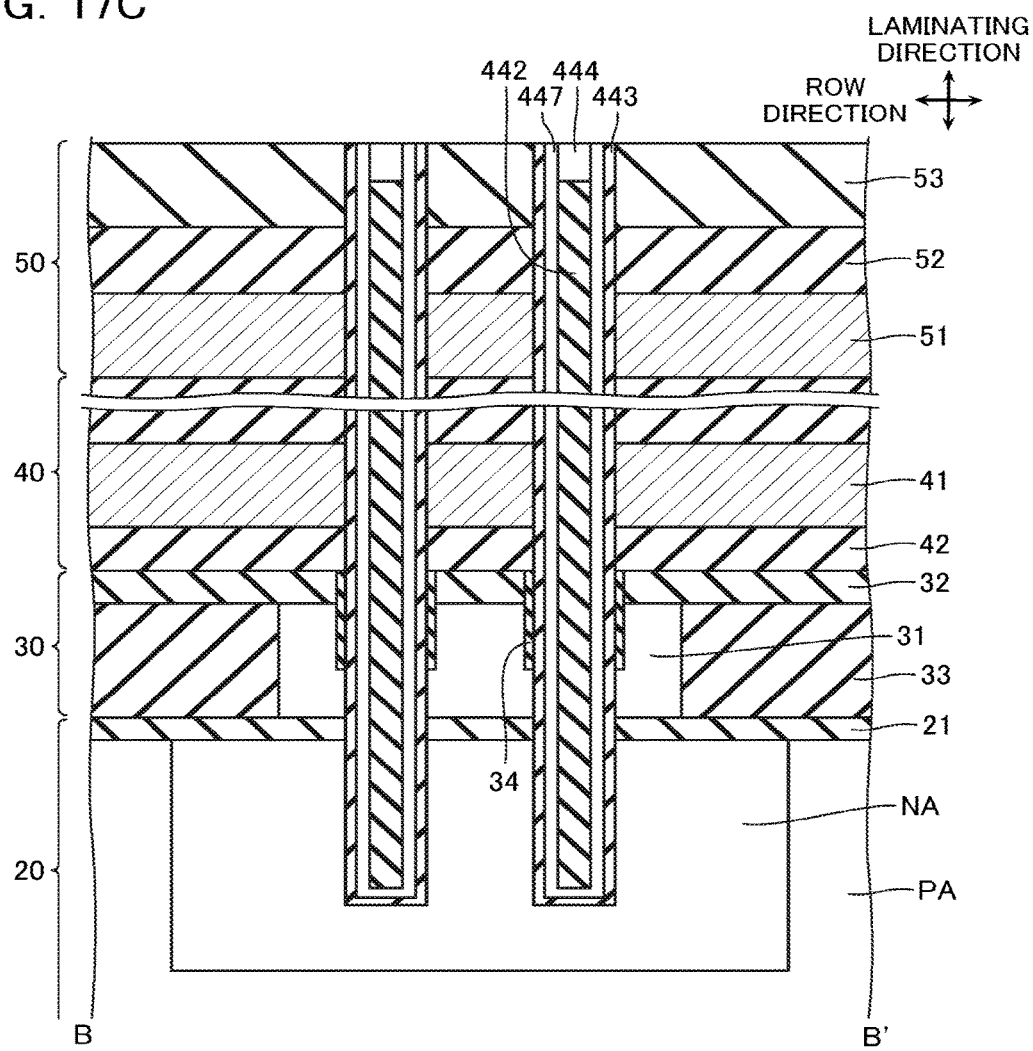
FIG. 17C is a cross-sectional view illustrating a part of the configuration of the semiconductor memory device, and corresponds to a cross-sectional view taken along a line B-B' in FIG. 17A.

The following describes a semiconductor memory device according to a second embodiment by referring to FIG. 17A to FIG. 17C. FIG. 17A is a plan view illustrating a schematic configuration of the semiconductor memory device according to the second embodiment. FIG. 17A corresponds to FIG. 4A. FIG. 17B and FIG. 17C are cross-sectional views taken along lines A-A' and B-B' in FIG. 17A respectively, and correspond to FIG. 4B and FIG. 4C respectively.

The semiconductor memory device according to the second embodiment has the overall configuration mostly identical to the semiconductor memory device according to the first embodiment. In the semiconductor memory device according to the second embodiment, as shown in FIG. 17B and FIG. 17C, a lower end of a columnar portion 447 of a memory semiconductor layer 441 passes through a back gate layer 30 to reach an n type semiconductor region NA of a substrate 20. As well as the first embodiment, a connecting portion 448 is disposed in the back gate layer 30 above the substrate 20, and connects a pair of the columnar portions 447 adjacent to one another in a column direction. This configuration in the second embodiment provides the memory semiconductor layer 441 with an approximately H shape viewed from a row direction.

This shape can also provide effects similarly to those in the first embodiment.

In this embodiment, the lower end of the columnar portion 447 reaches inside the substrate 20. Then, when a voltage is applied to the back gate conducting layer 31, only the memory film 443 exists between the On state memory semiconductor layer 441 and the substrate 20. This causes a large parasitic capacitance between the memory semiconductor layer 441 and the substrate 20 corresponding to the film type, the film thickness, or similar property of the memory film 443. However, in this embodiment, the columnar portion 447 is located in the n type semiconductor region NA. That is, different from the case where the substrate 20 is constituted of only a p type semiconductor region PA that causes the generation of the capacitance, the substrate 20 according to the embodiment includes the n type semiconductor region NA between the p type semiconductor region PA and the memory semiconductor layer 441. This ensures to further reduce the capacitance generating between the memory semiconductor layer 441 and the substrate 20.

The semiconductor memory device according to the second embodiment is manufactured when the etching is performed under the condition where a memory hole MH reaches the n type semiconductor region NA in the substrate 20 in a process to form the memory hole MH described by referring to FIG. 12A to FIG. 12C in the first embodiment.

Third Embodiment

Figure 18:
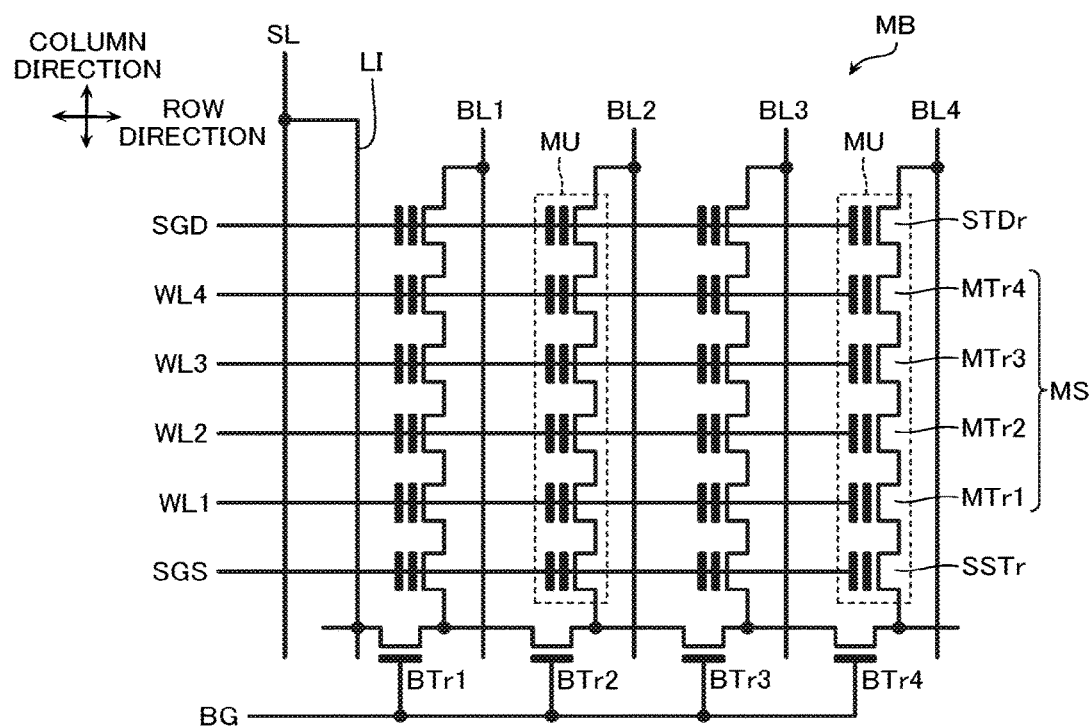
FIG. 18 is a circuit diagram illustrating a part of a configuration of a semiconductor memory device according to a third embodiment.
Figure 19:
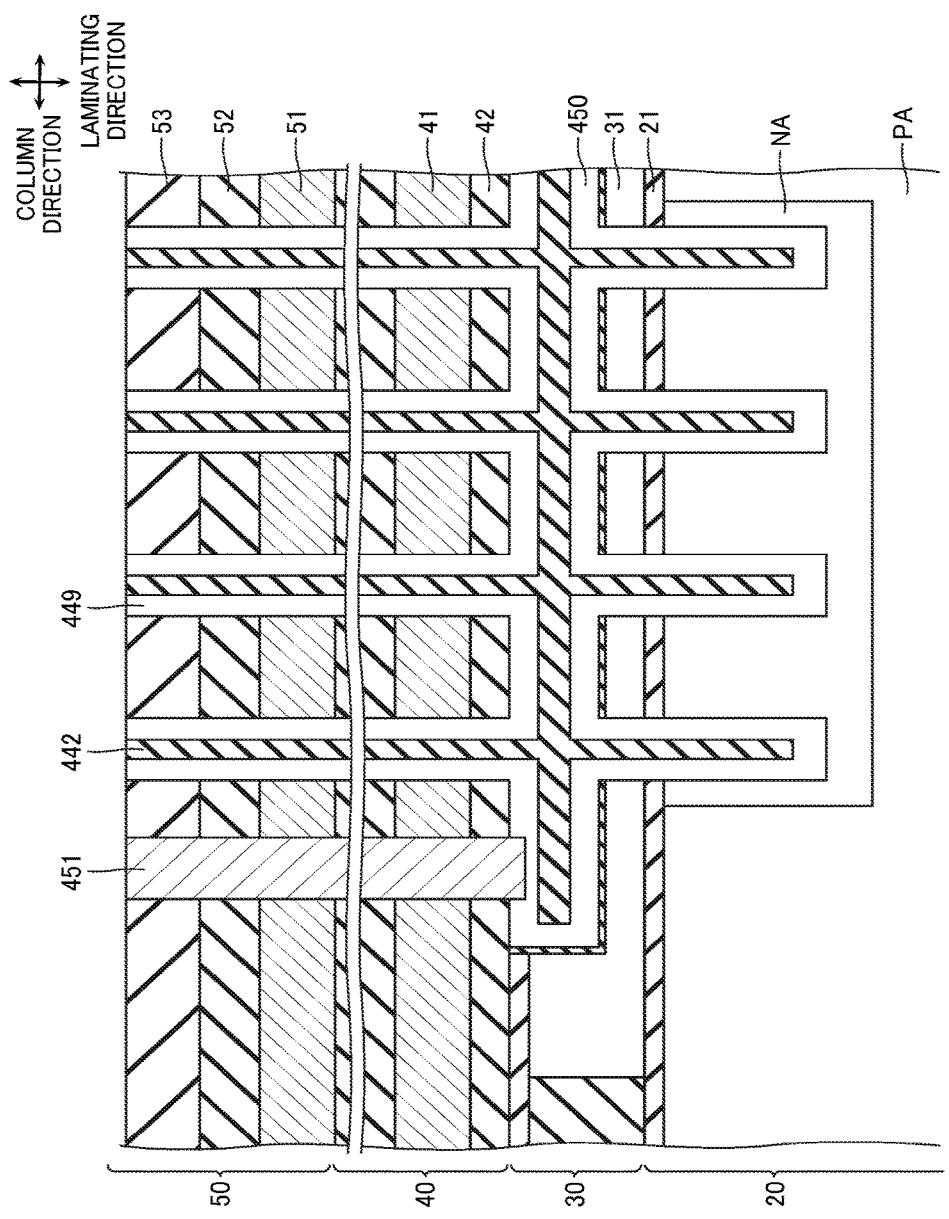
FIG. 19 is a schematic cross-sectional view illustrating apart of the configuration of the semiconductor memory device.

The following describes a semiconductor memory device according to a third embodiment by referring to FIG. 18 and FIG. 19.

The above-described first and second embodiment has the configurations where the connecting portion 448 connects the pair of the columnar portions 447 that are adjacent to one another and constitute the memory semiconductor layer 441, and the memory semiconductor layer 441 has the approximately U shape or approximately H shape viewed from a row direction. In other words, the memory semiconductor layer 441 that constitutes the memory string MS is configured to be folded back with the connecting portion 448 as a border.

On the other hand, in the third embodiment, instead of the folded back configuration of the first and the second embodiment, the memory string MS has the configuration where the memory semiconductor layer 441 has an I shape (linear shape) viewed from the row direction. That is, as shown in FIG. 18, a drain of a drain side selection transistor SDTr of a plurality of the memory units MU disposed in the row direction is connected to bit lines BL1 to 4. A source of a source side selection transistor SSTr is connected to a common source line SL via a source contact LI. The gate of each of the memory transistors MTr1 to MTr4 that constitutes the memory string MS is connected to the word lines WL1 to 4, respectively. The gates of the back gate transistors BTr1 to 4 are connected to the back gate line BG in common. The gate of the source side selection transistor SSTr is connected to the source side selection gate line SGS, and the gate of the drain side selection transistor SDTr is connected to the drain side selection gate line SGD.

As shown in FIG. 19, for example, a plurality of columnar semiconductor layers 449 extending in a direction perpendicular to the surface of the substrate 20 (laminating direction) are disposed on the substrate 20 along a column direction, and are connected via a connecting portion 450 extending in the column direction. The columnar semiconductor layer 449 functions as a body (channel) of each of the memory transistors Mtr1 to Mtr4. The connecting portion 450 functions as a body (channel) of each of the back gate transistors BTr1 to BTr4. The columnar semiconductor layer 449 and the connecting portion 450 are constituted of a semiconductor, for example, polysilicon.

Thus, in the third embodiment, the columnar semiconductor layer 449 constituting the memory string MS does not have the folded back configuration. That is, the columnar semiconductor layer 449 constituting the memory string MS has the I shape (the linear shape) instead of the U shape or the H shape viewed from the row direction.

This eliminates the need for the pair of the columnar portions 447 constituting one memory string MS to be insulated one another by the insulating layer 46 different from the first and the second embodiment. Therefore, it is not necessary to ensure a region for forming the insulating layer 46. This ensures to reduce the area of the entire device.

The connecting portion 450 is connected to a contact 451 that is disposed on the side portion of a plurality of the columnar semiconductor layers 449 disposed in the column direction, and extends above the substrate 20. Then, the contact 451 functions as a common source contact LI of the plurality of the columnar semiconductor layer 449. The contact 451 can be constituted of metal, for example, tungsten (W).

Then, the substrate 20 includes the n type semiconductor region NA including n type impurities facing to the end portions of the plurality of the columnar semiconductor layers 449 in the substrate 20 side in the laminating direction.

This shape can also provide effects similarly to those in the first embodiment.

In this embodiment, the lower end of the columnar semiconductor layer 449 reaches inside the substrate 20. Then, when a voltage is applied to the back gate conducting layer 31, only the memory film (not illustrated) exists between the On state columnar semiconductor layer 449 and the substrate 20. As described in the second embodiment, this causes a capacitance between the columnar semiconductor layer 449 and the substrate 20 corresponding to the film type, the film thickness, or similar property of the memory film. However, in this embodiment, the lower end of the columnar semiconductor layer 449 is located in the n type semiconductor region NA. This ensures to reduce the capacitance.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a semiconductor substrate having a first surface;
a first conducting layer disposed on the first surface of the semiconductor substrate via a first insulating layer;
a semiconductor layer disposed on the first conducting layer via a second insulating layer, the semiconductor layer extending in a first direction intersecting with the first surface of the semiconductor substrate;
a plurality of second conducting layers extending in a second direction intersecting with the first direction, being laminated along the first direction via a plurality of insulating layers and disposed above the first conducting layer; and
an electric charge accumulating layer disposed between the semiconductor layer and the plurality of second conducting layers, wherein
the semiconductor substrate is a p type semiconductor substrate and has an n type semiconductor region at the first surface, the n type semiconductor region facing the first conducting layer via the first insulating layer, and the n type semiconductor region being electrically isolated from the semiconductor layer via the second insulating layer.

2. The semiconductor memory device according to claim 1, wherein
a plurality of the semiconductor layers are disposed along a third direction intersecting with the first direction and the second direction, and
the semiconductor memory device further comprises a connecting portion that connects at least one pair of the semiconductor layers one another that are disposed in the third direction.

3. The semiconductor memory device according to claim 2, wherein
the first conducting layer covers side surfaces of the connecting portion.

4. The semiconductor memory device according to claim 2, wherein
the connecting portion is constituted of material identical to the semiconductor layer.

5. The semiconductor memory device according to claim 2, further comprising:
a source contact that functions as a common source line of the plurality of the semiconductor layers, wherein
the source contact is connected to the connecting portion.

6. The semiconductor memory device according to claim 1, wherein
the n type semiconductor region include at least phosphorus or arsenic.

7. The semiconductor memory device according to claim 1, wherein
the n type semiconductor region is not connected electrically to other parts of the semiconductor memory device.

8. The semiconductor memory device according to claim 1, further comprising:
a tunnel insulating layer disposed between the semiconductor layer and the electric charge accumulating layer.

9. The semiconductor memory device according to claim 1, further comprising:
a block insulating layer disposed between the electric charge accumulating layer and the plurality of second conducting layers.

10. The semiconductor memory device according to claim 1, wherein
the electric charge accumulating layer extends in the first direction, and the electric charge accumulating layer is disposed extending over the plurality of the second conducting layers.

11. The semiconductor memory device according to claim 1, wherein
a plurality of the semiconductor layers are disposed along a third direction that intersects with the first direction and the second direction, and
the n type semiconductor region is disposed extending over the plurality of the semiconductor layers disposed along the third direction.

12. The semiconductor memory device according to claim 1, wherein
a plurality of the semiconductor layers are disposed along the second direction, and the n type semiconductor region is disposed extending over the plurality of the semiconductor layers disposed along the second direction.

13. The semiconductor memory device according to claim 1, wherein
a p type semiconductor region covers side surfaces of the n type semiconductor region in the second direction and the third direction.

14. The semiconductor memory device according to claim 1, wherein
the semiconductor layer has a lower end located in the n type semiconductor region.

15. The semiconductor memory device according to claim 1, wherein
the end portion of the semiconductor layer is a lower end and is located in the first conducting layer.

* * * * *